US012793931B2

(12) United States Patent
Fang et al.

(10) Patent No.: US 12,793,931 B2
(45) Date of Patent: Nov. 10, 2026

(54) CROSS-TALK CANCELLATION IN MULTIPLE CHARGED-PARTICLE BEAM INSPECTION

(71) Applicant: ASML Netherlands B.V., Veldhoven (NL)

(72) Inventors: Wei Fang, Milpitas, CA (US); Lingling Pu, San Jose, CA (US); Bo Wang, Cupertino, CA (US); Zhonghua Dong, Sunnyvale, CA (US); Yongxin Wang, San Ramon, CA (US)

(73) Assignee: ASML Netherlands B.V., Veldhoven (NL)

( * ) Notice: Subject to any disclaimer, the term of this patent is extended or adjusted under 35 U.S.C. 154(b) by 275 days.

(21) Appl. No.: 18/787,932

(22) Filed: Jul. 29, 2024

(65) Prior Publication Data

US 2025/0006456 A1 Jan. 2, 2025

Related U.S. Application Data

(63) Continuation of application No. 17/633,176, filed as application No. PCT/EP2020/072332 on Aug. 8, 2020, now Pat. No. 12,080,513.

(Continued)

(51) Int. Cl.

*H01J 37/244* (2006.01)
*G01N 23/2251* (2018.01)

(Continued)

(52) U.S. Cl.

CPC ........ *H01J 37/222* (2013.01); *G01N 23/2251* (2013.01); *G06T 5/50* (2013.01);

(Continued)

(58) Field of Classification Search

CPC ........ H01J 37/222; H01J 37/244; H01J 37/28; H01J 2237/2817; H01J 2237/2809;

(Continued)

(56) References Cited

U.S. PATENT DOCUMENTS

| | | | |
|---|---|---|---|
| 6,844,550 | B1 | 1/2005 | Yin et al. |
| 8,106,357 | B2 | 1/2012 | Nakahira et al. |

(Continued)

FOREIGN PATENT DOCUMENTS

| | | | |
|---|---|---|---|
| CN | 101400991 | A | 4/2009 |
| CN | 108738343 | A | 11/2018 |

(Continued)

OTHER PUBLICATIONS

Kub F. J. et al., "Programmable Analog Vector—Matrix Multipliers," IEEE Journal of Solid-State Circuits, vol. 5, No. 1, pp. 207-214.

(Continued)

*Primary Examiner* — Sean Luck
(74) *Attorney, Agent, or Firm* — Finnegan, Henderson, Farabow, Garrett & Dunner LLP

(57) ABSTRACT

An improved apparatus and method for enhancing an image, and more particularly an apparatus and method for enhancing an image through cross-talk cancellation in a multiple charged-particle beam inspection are disclosed. An improved method for enhancing an image includes acquiring a first image signal of a plurality of image signals from a detector of a multi-beam inspection system. The first image signal corresponds to a detected signal from a first region of the detector on which electrons of a first secondary electron beam and of a second secondary electron beam are incident. The method includes reducing, from the first image signal, cross-talk contamination originating from the second secondary electron beam using a relationship between the first (Continued)

440 image signal and beam intensities associated with the first secondary electron beam and the second secondary electron beam. The method further includes generating a first image corresponding to first secondary electron beam after reduction.

20 Claims, 8 Drawing Sheets

Related U.S. Application Data

(60) Provisional application No. 62/886,882, filed on Aug. 14, 2019.

(51) Int. Cl.

| | |
|---|---|
| ***G06T 5/50*** | (2006.01) |
| ***G06T 5/77*** | (2024.01) |
| ***G06T 5/80*** | (2024.01) |
| ***H01J 37/22*** | (2006.01) |
| ***H01J 37/28*** | (2006.01) |

(52) U.S. Cl.

CPC .................. *G06T 5/77* (2024.01); *G06T 5/80* (2024.01); *H01J 37/244* (2013.01); *H01J 37/28* (2013.01); *G01N 2223/07* (2013.01); *G01N 2223/401* (2013.01); *G01N 2223/418* (2013.01); *G01N 2223/507* (2013.01); *G06T 2207/10061* (2013.01); *G06T 2207/20081* (2013.01); *H01J 2237/2448* (2013.01); *H01J 2237/2806* (2013.01); *H01J 2237/2809* (2013.01); *H01J 2237/2817* (2013.01)

(58) Field of Classification Search

CPC ...... H01J 2237/2806; H01J 2237/2448; G06T 5/80; G06T 5/77; G06T 5/50; G06T 2207/10061; G06T 2207/20081; G01N 23/2251; G01N 2223/07; G01N 2223/401; G01N 2223/418; G01N 2223/507

See application file for complete search history.

(56) References Cited

U.S. PATENT DOCUMENTS

| | | | |
|---|---|---|---|
| 8,653,454 | B2 | 2/2014 | Chen et al. |
| 9,020,281 | B2 | 4/2015 | Yamashita |
| 2004/0135515 | A1 | 7/2004 | Hamashima et al. |
| 2006/0169899 | A1 | 8/2006 | Parker et al. |
| 2007/0216428 | A1 | 9/2007 | Schmid et al. |
| 2007/0272856 | A1 | 11/2007 | Nijkerk et al. |
| 2009/0026389 | A1 | 1/2009 | Platzgummer |
| 2012/0321203 | A1 | 12/2012 | Yamashita |
| 2018/0336709 | A1 | 11/2018 | Persson |

FOREIGN PATENT DOCUMENTS

| | | | |
|---|---|---|---|
| TW | 200741230 | A | 11/2007 |
| WO | 2018145983 | A1 | 8/2018 |

OTHER PUBLICATIONS

PCT International Search Report and Written Opinion, corresponding to PCT Application No. PCT/EP2020/072332, mailed Jan. 19, 2021 (14 pages).

The Office Action issued by the Taiwanese Intellectual Property Office and Taiwanese Search Report, corresponding to Taiwanese Application No. 109127463, issued Apr. 28, 2021. (10 pages).

Office Action of the Intellectual Property Office of Taiwan issued in related Taiwanese Patent Application No. 111107313; mailed Apr. 10, 2023 (8 pgs.).

CROSS-TALK CANCELLATION IN MULTIPLE CHARGED-PARTICLE BEAM INSPECTION

CROSS-REFERENCE TO RELATED APPLICATIONS

This application is a continuation application of U.S. application Ser. No. 17/633,176, filed on Feb. 4, 2022, which claims priority of U.S. national phase entry under 35 U.S.C. § 371 of PCT International Application No. PCT/EP2020/072332, filed on Aug. 8, 2020, which claims priority of U.S. application 62/886,882 which was filed on Aug. 14, 2019. The entire contents of these prior applications are incorporated herein by reference.

TECHNICAL FIELD

The embodiments provided herein relate to an image enhancement technology, and more particularly cross-talk cancellation in a multiple charged-particle beam inspection.

BACKGROUND

In manufacturing processes of integrated circuits (ICs), unfinished or finished circuit components are inspected to ensure that they are manufactured according to design and are free of defects. Inspection systems utilizing optical microscopes or charged particle (e.g., electron) beam microscopes, such as a scanning electron microscope (SEM) can be employed. As the physical sizes of IC components continue to shrink, accuracy and yield in defect detection become more important. Although multiple electron beams may be used to increase the throughput, the limitation in fidelity of imaging signals received by charged-particle detectors may limit the imaging resolution desired for reliable defect detection and analysis rendering the inspection tools inadequate for their desired purpose.

SUMMARY

The embodiments provided herein disclose a particle beam inspection apparatus, and more particularly, an inspection apparatus using a plurality of charged particle beams.

In some embodiments, a method for enhancing an image includes acquiring a first image signal of a plurality of image signals from a detector of a multi-beam inspection system. The first image signal corresponds to a detected signal from a first region of the detector on which electrons of a first secondary electron beam and of a second secondary electron beam are incident. The method also includes reducing, from the first image signal, cross-talk contamination originating from the second secondary electron beam using a relationship between the first image signal and beam intensities associated with the first secondary electron beam and the second secondary electron beam. The method further includes generating a first image corresponding to the first secondary electron beam after the reduction.

In some embodiments, an image enhancing apparatus includes a memory storing a set of instructions and at least one processor configured to execute the set of instructions to cause the apparatus to perform acquiring a first image signal of a plurality of image signals from a detector of a multi-beam inspection system. The first image signal corresponds to a detected signal from a first region of the detector on which electrons of a first secondary electron beam and of a second secondary electron beam are incident. The at least one processor is also configured to execute the set of instructions to cause the apparatus to further perform reducing, from the first image signal, cross-talk contamination originating from the second secondary electron beam using a relationship between the first image signal and beam intensities associated with the first secondary electron beam and the second secondary electron beam. The at least one processor is further configured to execute the set of instructions to cause the apparatus to further perform generating a first image corresponding to the first secondary electron beam after the reduction.

In some embodiments, a non-transitory computer readable medium that stores a set of instructions that is executable by at least one processor of a computing device to cause perform a method for enhancing an image. The method includes acquiring a first image signal of a plurality of image signals from a detector of a multi-beam inspection system. The first image signal corresponds to a detected signal from a first region of the detector on which electrons of a first secondary electron beam and of a second secondary electron beam are incident. The method also includes reducing, from the first image signal, cross-talk contamination originating from the second secondary electron beam using a relationship between the first image signal and beam intensities associated with the first secondary electron beam and the second secondary electron beam. The method further includes generating a first image corresponding to the first secondary electron beam after the reduction.

In some embodiments, a method for reducing cross-talk contamination in a multi-beam inspection system includes acquiring a first image and a second image of a first area and a second area on a sample respectively by a multi-beam inspection system. The first image is generated based on a first detection signal from a first detection region of the multi-beam inspection system and the second image is generated based on a second detection signal from a second detection region of the multi-beam inspection system. The method also includes determining a main pattern of the first image originating from a first secondary electron beam by using a first reference image corresponding to the first area. The method further includes determining whether the first image includes a ghost pattern originating from a second secondary electron beam by using a second reference image corresponding to the second area. The method further includes determining a relationship between the first detection signal and beam intensities of the first secondary electron beam and the second secondary electron beam. The method further includes reducing cross-talk contamination from a third detection signal from the first detection region based on the determined relationship.

In some embodiments, a method for enhancing an image includes acquiring a first image from a detector of a multi-beam inspection system. The first image is generated based on a first detection signal from a first region of the detector on which electrons of a first secondary electron beam and of a second secondary electron beam are incident. The method also includes reducing, from the first image, cross-talk image originating from the second secondary electron beam based on a relationship between the first detection signal and beam intensities associated with the first secondary electron beam and the second secondary electron beam.

Other advantages of the embodiments of the present disclosure will become apparent from the following description taken in conjunction with the accompanying drawings wherein are set forth, by way of illustration and example, certain embodiments of the present invention.

DETAILED DESCRIPTION

Figure 1:
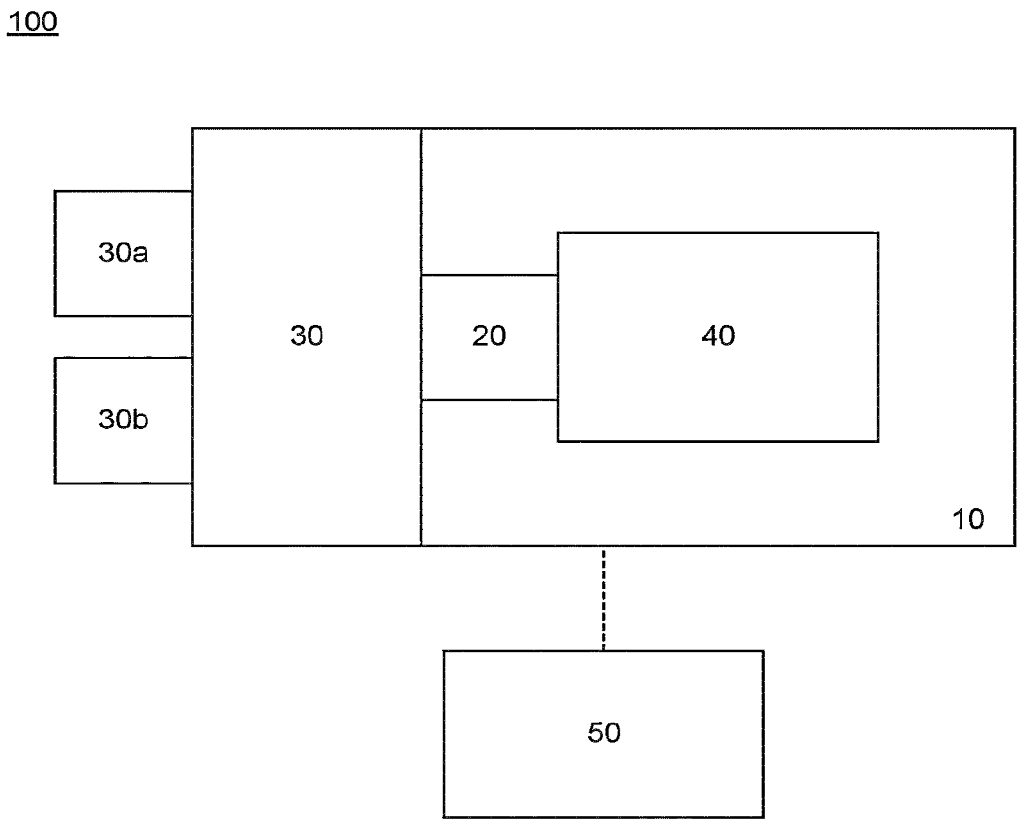
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations. Instead, they are merely examples of apparatuses and methods consistent with aspects related to the disclosed embodiments as recited in the appended claims. For example, although some embodiments are described in the context of utilizing electron beams, the disclosure is not so limited. Other types of charged particle beams may be similarly applied. Furthermore, other imaging systems may be used, such as optical imaging, photo detection, x-ray detection, etc.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than 1/1000th the size of a human hair.

Making these extremely small ICs is a complex, time-consuming, and expensive process, often involving hundreds of individual steps. Errors in even one step have the potential to result in defects in the finished IC rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). An SEM can be used to image these extremely small structures, in effect, taking a "picture" of the structures. The image can be used to determine if the structure was formed properly and also if it was formed in the proper location. If the structure is defective, then the process can be adjusted so the defect is less likely to recur.

Although a multiple charged-particle beam imaging system, such as a multi-beam SEM, may be useful in increasing the wafer inspection throughput, the imaging resolution of multi-beam SEM may be limited by the quality of the imaging signals received and detected by the secondary electron detection system. A secondary charged-particle beam such as an electron beam, generated by the interaction of primary beamlets on sample surface, may comprise secondary electrons with a large energy spread of ~50 eV and a large emission angle range of ~90° with respect to a normal of the sample surface. Such defocused electron beams may have a large incidence spot on a secondary electron detector. In conventional multi-beam SEMs, the defocused electron beam may be incident upon multiple detection elements of the secondary electron detector. In other words, each of the multiple detection elements may receive secondary electrons from a corresponding secondary electron beam and other adjacent beams. Consequently, the imaging signal of one detection element may comprise an intended signal originating from the corresponding secondary electron beam that is intended to be incident onto the one detection element (e.g., signal corresponding to image of FIG. 3A) and one or more cross-talk signals originating from adjacent electron beams that are not intended to be incident onto the one detection element (e.g., signal corresponding to image of FIG. 3B), resulting in a contaminated image (e.g., image of FIG. 3C). The cross-talk contamination, among other things, may deteriorate the fidelity of the imaging signal. Therefore, it is desirable to minimize cross-talk of the secondary electron beams between multiple detection elements to enhance the imaging resolution.

To reduce the occurrence of cross-talk, various efforts have been made. However, it is quite challenging to completely remove cross-talk with mechanical and electronical techniques. Further, even with a computational method, it is difficult to detect and remove cross-talk contamination. Embodiments of the present disclosure can provide techniques to reduce cross-talk contamination from detection signals in real time. In the present disclosure, a plurality of images including a particular image and surrounding images thereof can be used to obtain a transform function, which can remove at least a part of cross-talk contamination from detection signals, such as by using machine learning.

Relative dimensions of components in drawings may be exaggerated for clarity. Within the following description of drawings, the same or like reference numbers refer to the same or like components or entities, and only the differences with respect to the individual embodiments are described. As used herein, unless specifically stated otherwise, the term "or" encompasses all possible combinations, except where infeasible. For example, if it is stated that a component may include A or B, then, unless specifically stated otherwise or infeasible, the component may include A. or B, or A and B. As a second example, if it is stated that a component may include A, B, or C, then, unless specifically stated otherwise or infeasible, the component may include A, or B, or C, or A and B, or A and C, or B and C, or A and B and C.

Reference is now made to FIG. 1, which illustrates an exemplary electron beam inspection (EBI) system 100 consistent with embodiments of the present disclosure. As shown in FIG. 1, charged particle beam inspection system 100 includes a main chamber 10, a load-lock chamber 20, an electron beam tool 40, and an equipment front end module (EFEM) 30. Electron beam tool 40 is located within main chamber 10. While the description and drawings are directed to an electron beam, it is appreciated that the embodiments are not used to limit the present disclosure to specific charged particles.

EFEM 30 includes a first loading port 30*a* and a second loading port 30*b*. EFEM 30 may include additional loading port(s). First loading port 30*a* and second loading port 30*b* receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 30 transport the wafers to load-lock chamber 20.

Load-lock chamber 20 is connected to a load/lock vacuum pump system (not shown), which removes gas molecules in load-lock chamber 20 to reach a first pressure below the atmospheric pressure. After reaching the first pressure, one or more robot arms (not shown) transport the wafer from load-lock chamber 20 to main chamber 10. Main chamber 10 is connected to a main chamber vacuum pump system (not shown), which removes gas molecules in main chamber 10 to reach a second pressure below the first pressure. After reaching the second pressure, the wafer is subject to inspection by electron beam tool 40. In some embodiments, electron beam tool 40 may comprise a single-beam inspection tool. In other embodiments, electron beam tool 40 may comprise a multi-beam inspection tool.

Controller 50 may be electronically connected to electron beam tool 40 and may be electronically connected to other components as well. Controller 50 may be a computer configured to execute various controls of charged particle beam inspection system 100. Controller 50 may also include processing circuitry configured to execute various signal and image processing functions. While controller 50 is shown in FIG. 1 as being outside of the structure that includes main chamber 10, load-lock chamber 20, and EFEM 30, it is appreciated that controller 50 can be part of the structure.

While the present disclosure provides examples of main chamber 10 housing an electron beam inspection system, it should be noted that aspects of the disclosure in their broadest sense, are not limited to a chamber housing an electron beam inspection system. Rather, it is appreciated that the foregoing principles may be applied to other chambers as well.

Figure 2:
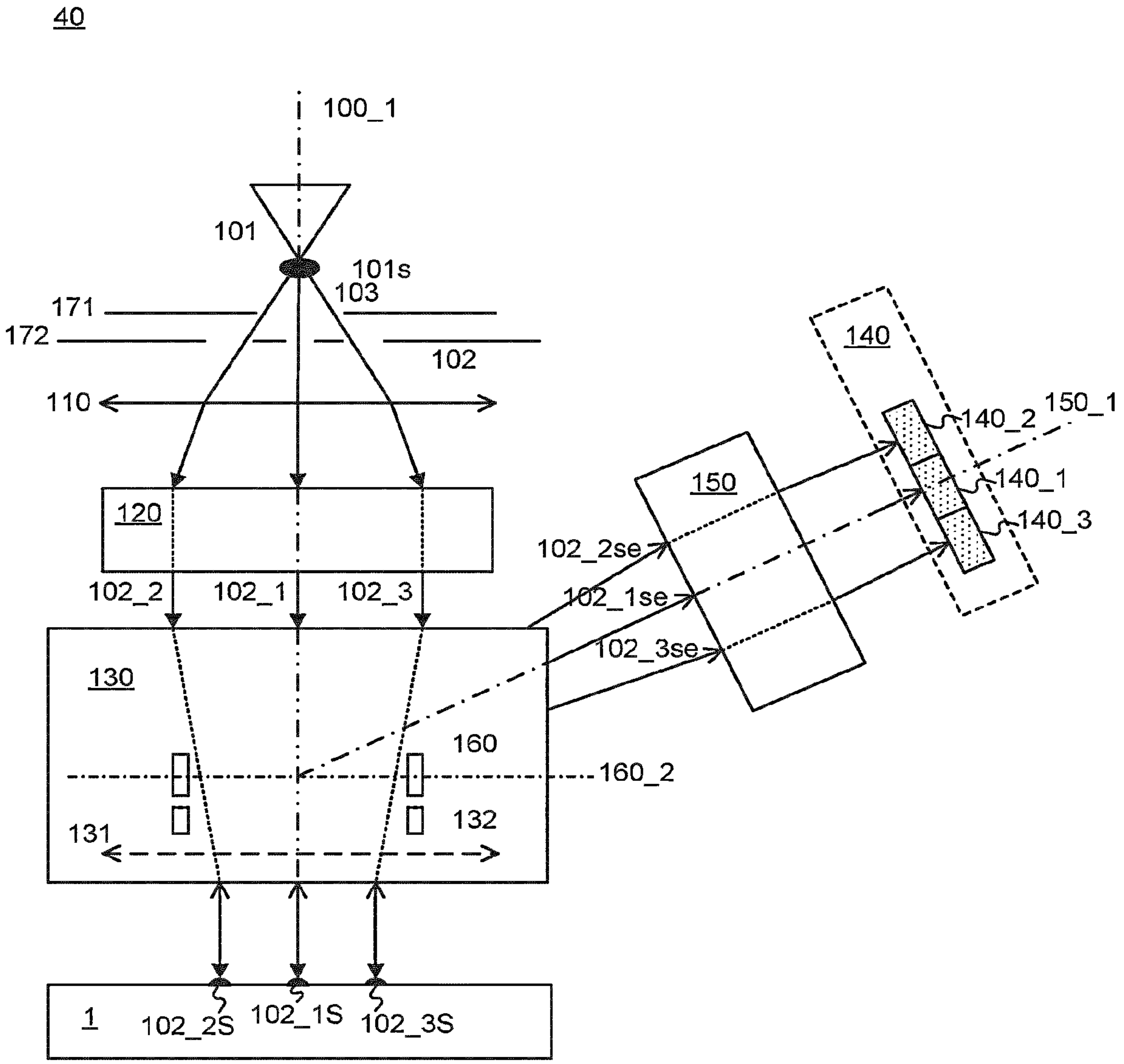
FIG. 2 is a schematic diagram illustrating an exemplary electron beam tool that can be a part of the exemplary electron beam inspection system of FIG. 1, consistent with embodiments of the present disclosure.

Reference is now made to FIG. 2, which illustrates a schematic diagram illustrating an exemplary electron beam tool 40 that can be a part of the exemplary charged particle beam inspection system 100 of FIG. 1, consistent with embodiments of the present disclosure. An electron beam tool 40 (also referred to herein as apparatus 40) comprises an electron source 101, a gun aperture plate 171 with a gun aperture 103, a pre-beamlet forming mechanism 172, a condenser lens 110, a source conversion unit 120, a primary projection optical system 130, a sample stage (not shown in FIG. 2), a secondary imaging system 150, and an electron detection device 140. Primary projection optical system 130 can comprise an objective lens 131. Electron detection device 140 can comprise a plurality of detection elements 140_1, 140_2, and 140_3. Beam separator 160 and deflection scanning unit 132 can be placed inside primary projection optical system 130. It may be appreciated that other commonly known components of apparatus 40 may be added/omitted as appropriate.

Electron source 101, gun aperture plate 171, condenser lens 110, source conversion unit 120, beam separator 160, deflection scanning unit 132, and primary projection optical system 130 can be aligned with a primary optical axis 100_1 of apparatus 100. Secondary imaging system 150 and electron detection device 140 can be aligned with a secondary optical axis 150_1 of apparatus 40.

Electron source 101 can comprise a cathode, an extractor or an anode, wherein primary electrons can be emitted from the cathode and extracted or accelerated to form a primary electron beam 102 that forms a crossover (virtual or real) 101*s*. Primary electron beam 102 can be visualized as being emitted from crossover 101*s*.

Source conversion unit 120 may comprise an image-forming element array (not shown in FIG. 2), an aberration compensator array (not shown), a beam-limit aperture array (not shown), and a pre-bending micro-deflector array (not shown). The image-forming element array can comprise a plurality of micro-deflectors or micro-lenses to form a plurality of parallel images (virtual or real) of crossover 101*s* with a plurality of beamlets of primary electron beam 102. FIG. 2 shows three beamlets 102_1. 102_2, and 102_3 as an example, and it is appreciated that the source conversion unit 120 can handle any number of beamlets.

In some embodiments, source conversion unit 120 may be provided with beam-limit aperture array and image-forming element array (both are not shown). The beam-limit aperture array may comprise beam-limit apertures. It is appreciated that any number of apertures may be used, as appropriate. Beam-limit apertures may be configured to limit sizes of beamlets 102_1, 102_2, and 102_3 of primary-electron beam 102. The image-forming element array may comprise image-forming deflectors (not shown) configured to deflect beamlets 102_1, 102_2, and 102_3 by varying angles towards primary optical axis 100_1. In some embodiments, deflectors further away from primary optical axis 100_1 may deflect beamlets to a greater extent. Furthermore, image-forming element array may comprise multiple layers (not illustrated), and deflectors may be provided in separate layers. Deflectors may be configured to be individually controlled independent from one another. In some embodiments, a deflector may be controlled to adjust a pitch of probe spots (e.g., 102_1S. 102_2S, and 102_3S) formed on a surface of sample 1. As referred to herein, pitch of the probe spots may be defined as the distance between two immediately adjacent probe spots on the surface of sample 1.

A centrally located deflector of image-forming element array may be aligned with primary optical axis 100_1 of electron beam tool 40. Thus, in some embodiments, a central deflector may be configured to maintain the trajectory of beamlet 102_1 to be straight. In some embodiments, the central deflector may be omitted. However, in some embodiments, primary electron source 101 may not necessarily be aligned with the center of source conversion unit 120. Furthermore, it is appreciated that while FIG. 2 shows a side view of apparatus 40 where beamlet 102_1 is on primary optical axis 100_1, beamlet 102_1 may be off primary optical axis 100_1 when viewed from a different side. That is, in some embodiments, all of beamlets 102_1, 102_2, and 102_3 may be off-axis. An off-axis component may be offset relative to primary optical axis 100_1.

The deflection angles of the deflected beamlets may be set based on one or more criteria. In some embodiments, deflectors may deflect off-axis beamlets radially outward or away (not illustrated) from primary optical axis 100_1. In some embodiments, deflectors may be configured to deflect off-axis beamlets radially inward or towards primary optical axis 100_1. Deflection angles of the beamlets may be set so that beamlets 102_1, 102_2, and 102_3 land perpendicularly on sample 1. Off-axis aberrations of images due to lenses, such as objective lens 131, may be reduced by adjusting paths of the beamlets passing through the lenses. Therefore, deflection angles of off-axis beamlets 102_2 and 102_3 may be set so that probe spots 102_2S and 102_3S have small aberrations. Beamlets may be deflected so as to pass through or close to the front focal point of objective lens 131 to decrease aberrations of off-axis probe spots 102_2S and 102_3S. In some embodiments, deflectors may be set to make beamlets 102_1, 102_2, and 102_3 land perpendicularly on sample 1 while probe spots 102_1S, 102_2S, and 102_3S have small aberrations.

Condenser lens 110 is configured to focus primary electron beam 102. The electric currents of beamlets 102_1, 102_2, and 102_3 downstream of source conversion unit 120 can be varied by adjusting the focusing power of condenser lens 110 or by changing the radial sizes of the corresponding beam-limit apertures within the beam-limit aperture array. The electric currents may be changed by both, altering the radial sizes of beam-limit apertures and the focusing power of condenser lens 110. Condenser lens 110 may be an adjustable condenser lens that may be configured so that the position of its first principle plane is movable. The adjustable condenser lens may be configured to be magnetic, which may result in off-axis beamlets 102_2 and 102_3 illuminating source conversion unit 120 with rotation angles. The rotation angles may change with the focusing power or the position of the first principal plane of the adjustable condenser lens. Accordingly, condenser lens 110 may be an anti-rotation condenser lens that may be configured to keep the rotation angles unchanged while the focusing power of condenser lens 110 is changed. In some embodiments, condenser lens 110 may be an adjustable anti-rotation condenser lens, in which the rotation angles do not change when the focusing power and the position of the first principal plane of condenser lens 110 are varied.

Electron beam tool 40 may comprise pre-beamlet forming mechanism 172. In some embodiments, electron source 101 may be configured to emit primary electrons and form a primary electron beam 102. In some embodiments, gun aperture plate 171 may be configured to block off peripheral electrons of primary electron beam 102 to reduce the Coulomb effect. In some embodiments, pre-beamlet-forming mechanism 172 further cuts the peripheral electrons of primary electron beam 102 to further reduce the Coulomb effect. Primary-electron beam 102 may be trimmed into three primary electron beamlets 102_1, 102_2, and 102_3 (or any other number of beamlets) after passing through pre-beamlet forming mechanism 172. Electron source 101, gun aperture plate 171, pre-beamlet forming mechanism 172, and condenser lens 110 may be aligned with a primary optical axis 100_1 of electron beam tool 40.

Pre-beamlet forming mechanism 172 may comprise a Coulomb aperture array. A center aperture, also referred to herein as the on-axis aperture, of pre-beamlet-forming mechanism 172 and a central deflector of source conversion unit 120 may be aligned with primary optical axis 100_1 of electron beam tool 40. Pre-beamlet-forming mechanism 172 may be provided with a plurality of pre-trimming apertures (e.g., a Coulomb aperture array). In FIG. 2, the three beamlets 102_1, 102_2 and 102_3 are generated when primary electron beam 102 passes through the three pre-trimming apertures, and much of the remaining part of primary electron beam 102 is cut off. That is, pre-beamlet-forming mechanism 172 may trim much or most of the electrons from primary electron beam 102 that do not form the three beamlets 102_1, 102_2 and 102_3. Pre-beamlet-forming mechanism 172 may cut off electrons that will ultimately not be used to form probe spots 102_1S, 102_2S and 102_3S before primary electron beam 102 enters source conversion unit 120. In some embodiments, a gun aperture plate 171 may be provided close to electron source 101 to cut off electrons at an early stage, while pre-beamlet forming mechanism 172 may also be provided to further cut off electrons around a plurality of beamlets. Although FIG. 2 demonstrates three apertures of pre-beamlet forming mechanism 172, it is appreciated that there may be any number of apertures, as appropriate.

In some embodiments, pre-beamlet forming mechanism 172 may be placed below condenser lens 110. Placing pre-beamlet forming mechanism 172 closer to electron source 101 may more effectively reduce the Coulomb effect. In some embodiments, gun aperture plate 171 may be omitted when pre-beamlet forming mechanism 172 is able to be located sufficiently close to source 101 while still being manufacturable.

Objective lens 131 may be configured to focus beamlets 102_1, 102_2, and 102_3 onto a sample 1 for inspection and can form three probe spots 102_1*s*, 102_2*s*, and 102_3*s* on surface of sample 1. Gun aperture plate 171 can block off peripheral electrons of primary electron beam 102 not in use to reduce Coulomb interaction effects. Coulomb interaction effects can enlarge the size of each of probe spots 102_1*s*, 102_2*s*, and 102_3*s*, and therefore deteriorate inspection resolution.

Beam separator 160 may be a beam separator of Wien filter type comprising an electrostatic deflector generating an electrostatic dipole field E1 and a magnetic dipole field B1 (both of which are not shown in FIG. 2). If they are applied, the force exerted by electrostatic dipole field E1 on an electron of beamlets 102_1, 102_2, and 102_3 is equal in magnitude and opposite in direction to the force exerted on the electron by magnetic dipole field B1. Beamlets 102_1, 102_2, and 102_3 can therefore pass straight through beam separator 160 with zero deflection angles.

Deflection scanning unit 132 can deflect beamlets 102_1, 102_2, and 102_3 to scan probe spots 102_1*s*, 102_2*s*, and 102_3*s* over three small scanned areas in a section of the surface of sample 1. In response to incidence of beamlets 102_1, 102_2, and 102_3 at probe spots 102_1*s*, 102_2*s*, and 102_3*s*, three secondary electron beams 102_1*se*, 102_2*se*, and 102_3*se* may be emitted from sample 1. Each of secondary electron beams 102_1*se*, 102_2*se*, and 102_3*se* can comprise electrons with a distribution of energies including secondary electrons (energies≤50 eV) and backscattered electrons (energies between 50 eV and landing energies of beamlets 102_1, 102_2, and 102_3). Beam separator 160 can direct secondary electron beams 102_1*se*, 102_2*se*, and 102_3*se* towards secondary imaging system 150. Secondary imaging system 150 can focus secondary electron beams 102_1*se*, 102_2*se*, and 102_3*se* onto detection elements 140_1, 140_2, and 140_3 of electron detection device 140. Detection elements 140_1, 140_2, and 140_3 can detect corresponding secondary electron beams 102_1*se*, 102_2*se*, and 102_3*se* and generate corresponding signals used to construct images of the corresponding scanned areas of sample 1.

In FIG. 2, three secondary electron beams 102_1*se*, 102_2*se*, and 102_3*se* respectively generated by three probe spots 102_1S, 102_2S, and 102_3S, travel upward towards electron source 101 along primary optical axis 100_1, pass through objective lens 131 and deflection scanning unit 132 in succession. The three secondary electron beams 102_1*se*, 102_2*se* and 102_3*se* are diverted by beam separator 160 (such as a Wien Filter) to enter secondary imaging system 150 along secondary optical axis 150_1 thereof. Secondary imaging system 150 focuses the three secondary electron beams 102_1*se*~102_3*se* onto electron detection device 140 which comprises three detection elements 140_1, 140_2, and 140_3. Therefore, electron detection device 140 can simultaneously generate the images of the three scanned regions scanned by the three probe spots 102_1S, 102_2S and 102_3S, respectively. In some embodiments, electron detection device 140 and secondary imaging system 150 form one detection unit (not shown). In some embodiments, the electron optics elements on the paths of secondary electron beams such as, but not limited to, objective lens 131, deflection scanning unit 132, beam separator 160, secondary imaging system 150 and electron detection device 140, may form one detection system.

In some embodiments, controller 50 may comprise an image processing system that includes an image acquirer (not shown) and a storage (not shown). The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to electron detection device 140 of apparatus 40 through a medium such as an electrical conductor, optical fiber cable, portable storage media, IR, Bluetooth, internet, wireless network, wireless radio, among others, or a combination thereof. In some embodiments, the image acquirer may receive a signal from electron detection device 140 and may construct an image. The image acquirer may thus acquire images of sample 1. The image acquirer may also perform various post-processing functions, such as generating contours, superimposing indicators on an acquired image, and the like. The image acquirer may be configured to perform adjustments of brightness and contrast, etc. of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

In some embodiments, the image acquirer may acquire one or more images of a sample based on one or more imaging signals received from electron detection device 140. An imaging signal may correspond to a scanning operation for conducting charged particle imaging. An acquired image may be a single image comprising a plurality of imaging areas or may involve multiple images. The single image may be stored in the storage. The single image may be an original image that may be divided into a plurality of regions. Each of the regions may comprise one imaging area containing a feature of sample 1. The acquired images may comprise multiple images of a single imaging area of sample 1 sampled multiple times over a time sequence or may comprise multiple images of different imaging areas of sample 1. The multiple images may be stored in the storage. In some embodiments, controller 50 may be configured to perform image processing steps with the multiple images of the same location of sample 1.

In some embodiments, controller 50 may include measurement circuitries (e.g., analog-to-digital converters) to obtain a distribution of the detected secondary electrons. The electron distribution data collected during a detection time window, in combination with corresponding scan path data of each of primary beamlets 102_1, 102_2, and 102_3 incident on the wafer surface, can be used to reconstruct images of the wafer structures under inspection. The reconstructed images can be used to reveal various features of the internal or external structures of sample 1, and thereby can be used to reveal any defects that may exist in the wafer.

In some embodiments, controller 50 may control a motorized stage (not shown) to move sample 1 during inspection. In some embodiments, controller 50 may enable the motorized stage to move sample 1 in a direction continuously at a constant speed. In other embodiments, controller 50 may enable the motorized stage to change the speed of the movement of sample 1 over time depending on the steps of scanning process. In some embodiments, controller 50 may adjust a configuration of primary projection optical system 130 or secondary imaging system 150 based on images of secondary electron beams 102_1*se*, 102_2*se*, and 102_3*sc*.

Although FIG. 2 shows that electron beam tool 40 uses three primary electron beams, it is appreciated that electron beam tool 40 may use two or more number of primary electron beams. The present disclosure does not limit the number of primary electron beams used in apparatus 40.

As explained regarding FIG. 2, a surface of sample 1 is scanned simultaneously with multiple primary electron beams or beamlets 102_1, 102_2, and 102_3 at different locations such as probe spots 102_1S, 102_2S, and 102_3S. Multiple secondary electron beams 102_1*se*, 102_2*se*, and 102_3*se* emitted from the sample 1 and corresponding to multiple primary electron beams 102_1, 102_2, and 102_3, respectively, can be detected at their corresponding areas on an electron detection device 140. For example, it can be designed that a first secondary electron beam 102_1*se* is detected on a first detection element 140_1, a second secondary electron beam 102_2*se* is detected on a second detection element 140_2, and a third secondary electron beam 102_3*se* is detected on a third detection element 140_3. Defocused secondary electron beams are generated, but not limited to, due to aberrations and imperfection of a secondary optical system and a beam separation device of electron beam tool 40 during a projection process of the secondary electron beams. Such defocused secondary electron beams may be incident upon multiple detection elements other than its corresponding detection element. Consequently, the imaging signal of one detection element may comprise an intended signal originating from the corresponding secondary electron beam and one or more cross-talk signals originating from adjacent electron beams. Therefore, an image constructed from the detected image signal of one detection element may comprise a main pattern originating from the intended signal and a ghost pattern originating from the cross-talk signals.

Figure 3C:
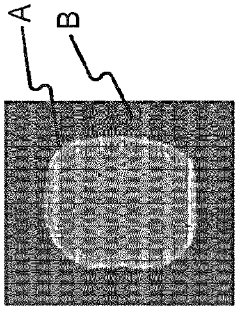
FIGS. 3A-3C are examples of an electron beam image with a first pattern, an electron beam image with a second pattern, and an electron beam image with cross-talk contamination, respectively.
Figure 3B:
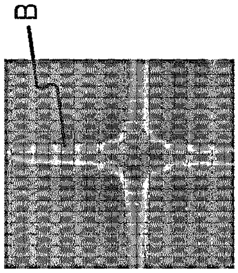
Figure 3A:
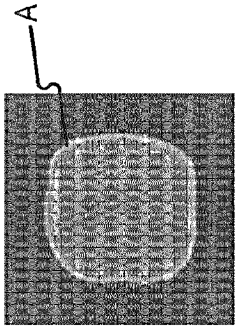

Reference is now made to FIGS. 3A-3C, which are examples of an electron beam image with a first pattern A, an electron beam image with a second pattern B, and an electron beam image with cross-talk contamination. For example, FIG. 3A can be an image reconstructed from an electron detection signal from a first detection element 140_1 when no cross-talk signals are incident on the first detection element 140_1 except the intended secondary electron beam 102_1*se*. Here, the image shown in FIG. 3A from the first detection element 140_1 comprises a pattern A having a dot shape. FIG. 3B can be an image reconstructed from an electron detection signal from a second detection element 140_2 when no cross-talk signals are incident on the second detection element 140_2 except the intended secondary electron beam 102_2*se*. Here, the image shown in FIG. 3B from the second detection element 140_2 comprises a pattern B having a cross shape. FIG. 3C illustrates an example of an image generated based on an electron detection signal from a first detection element 140_1 when a cross-talk signal originating from a second secondary electron beam 102_2*se* in addition to an intended first secondary electron beam 102_1*se* are incident on the first detection element 140_1. Accordingly, the image shown in FIG. 3C from the first detection element 140_1 comprises a ghost pattern B as well as a main pattern A. Such ghost patterns in a SEM image will result in a higher false defect detection rate. Therefore, it is desirable to minimize cross-talk to enhance the imaging resolution.

It is difficult to detect and remove cross-talk contamination for some or all of the following reasons, among others: (1) There is hardship in detecting and defining cross-talk contamination from detection signals or reconstructed images without the aid of external information; (2) Distinguishing ghost artefacts such as ghost patterns from main patterns is difficult because ghost patterns and main patterns usually have many features in common, such as in a frequency domain or a spatial domain; (3) Even after areas for ghost patterns are detected or defined, it is difficult to completely remove the artefacts without damaging original patterns or background images because it requires accurate estimation of artefact signals and seamless recovery of original patterns and underlying background images; (4) Reference images such as in a Graphic Database System (GDS) format can only help finding rough positions of ghost patterns, therefore, it is still challenge to detect exact pixel-level positions of the ghost patterns; (5) Moreover, identifying cross-talk artefacts and calculating amount of cross-talk components are time consuming and onerous. Embodiments of the present disclosure can provide techniques to reduce, minimize, or remove cross-talk contamination from detection signals, which can be performed offline or in a batch mode, or which can be performed in real time.

Figure 4:
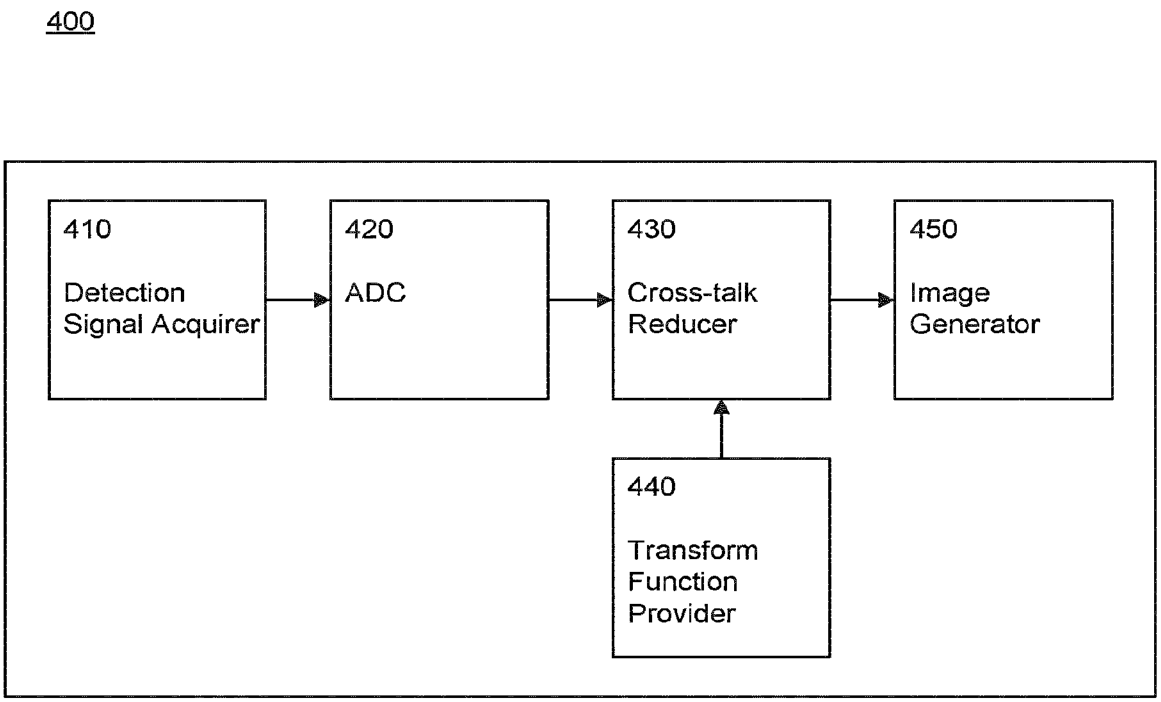
FIG. 4 is a block diagram of an exemplary image enhancement apparatus, consistent with embodiments of the present disclosure.

FIG. 4 is a block diagram of an exemplary image enhancement apparatus, consistent with embodiments of the present disclosure. It is appreciated that in various embodiments image enhancement apparatus 400 may be part of or may be separate from a charged-particle beam inspection system (e.g., electron beam inspection system 100 of FIG. 1). In some embodiments, image enhancement apparatus 400 may be part of controller 50 and may include an image acquirer, measurement circuitry, or storage, or the like. Further, image enhancement apparatus 400 may comprise an image processing system and may include image acquirer, storage, or the like.

In some embodiments, as illustrated in FIG. 4, image enhancement apparatus 400 may include detection signal acquirer 410, analog to digital converter (ADC) 420, cross-talk reducer 430, transform function provider 440, and image generator 450. In some embodiments, image enhancement apparatus 400 receives data from electron beam tool 40 of FIG. 2.

According to embodiments of the present disclosure, detection signal acquirer 410 may receive a detection signal from electron detection device 140 of electron beam tool 40. In some embodiments, detection signal acquirer 410 may be communicatively coupled to electron detection device 140 of electron beam tool 40 through a medium such as an electrical conductor, optical fiber cable, portable storage media, IR, Bluetooth, internet, wireless network, wireless radio, among others, or a combination thereof. As illustrated in FIG. 2, electron detection device 140 can comprise a plurality of detection elements. Although FIG. 2 shows that electron detection device 140 include three detection elements 140_1, 140_2, and 140_3 arranged in one line, it is appreciated that electron detection device 140 may include any number of detection elements of any arrangement. For example, electron detection device 140 can have m-number of detection elements that are arranged in a matrix with k-number of rows and n-number of columns. Here, "k" and "n" can be natural numbers equal to or greater than 1 and "m" can be a natural number equal to or greater than 2. Accordingly, in some embodiments, detection signal acquirer 410 may receive m-number of detection signals $s_1$ to $s_m$ corresponding to m-number of detection elements 140_1 to 140_*m*. It is appreciated that the acquired detection signals $s_1$ to $s_m$ can be subject to various signal processing, for example, amplification, noise cancellation, and the like. Detection signals $s_1$ to $s_m$ acquired from electron detection device 140 can be analog signals.

Analog to digital converter (ADC) 420 is configured to convert acquired analog detection signals to digital detection signals $s_1$ to $s_m$. In this disclosure, an analog detection signal and a corresponding digital detection signal are represented with an identical reference such as $s_m$. In some embodiments, ADC 420 converts analog detection signals to digital detection signals $s_1$ to $s_m$ to obtain a distribution of the detected secondary electrons. The electron distribution data collected during a detection time window, in combination with corresponding scan path data of each of primary beamlets 102_1, 102_2, and 102_3 incident on the wafer surface, can be used to generate images of the wafer structures under inspection.

As discussed above, detection signals $s_1$ to $s_m$ may comprise cross-talk signals in addition to a corresponding intended signal. For example, with respect to FIG. 2, a first detection signal $s_1$ detected from a first detection element 140_1 can comprise an intended signal originating from a first secondary electron beam 102_1*se* and cross-talk signals originating from adjacent secondary electron beams 102_2*se*, 102_3*se*, or both 102_2*se* and 102_3*se*. It is understood that electrons from any of the second secondary electron beams can arrive at the first detection element 140_1, although electrons from secondary electron beams adjacent to the intended signal are more likely to contaminate. Similarly, a second detection signal $s_2$ detected from a second detection element 140_2 can comprise an intended signal originating from a second secondary electron beam 102_2*se* and cross-talk signals originating from other secondary electron beams (e.g., first secondary electron beam 102_1*se*). Similarly, any detection signal $s_1$ to $s_m$ detected from a corresponding detection element 140_1 to 140_*m* can comprise an intended signal originating from a corresponding secondary electron beam and cross-talk signals originating from secondary electron beams other than the intended secondary electron beam.

Referring back to FIG. 4, cross-talk reducer 430 may reduce cross-talk contamination from detection signal $s_1$ to $s_m$. According to embodiments of the present disclosure, cross-talk reducer 430 may reduce cross-talk contamination from detection signal $s_1$ to $s_m$ by using a transform function obtained from transform function provider 440, which will be explained in detail with respect to FIG. 5. The principle for reducing cross-talk contamination from detection signal $s_1$ to $s_m$ is mathematically explained below.

A detection signal from each detection element is represented by $s_i$, where i is an index number corresponding to an $i^{th}$ detection element 140_*i*. An intensity of each secondary electron beam is represented by $b_j$, where j is an index number corresponding to a $j^{th}$ secondary electron beam 102_*jse*. It is assumed in the present disclosure that m-number of secondary electron beams and m-number of detection elements are included, here m is a natural number equal to or greater than 2. In some embodiments, the number of secondary electron beams and the number of detection elements may be different. The intensities I of secondary electron beams 102_1*se* to 102_*mse* and detection signals S from electron detection device 140 can be expressed as matrices or vectors as follows:

$$I = (b_1 \cdots b_m)^T \quad \text{(Equation 1)}$$

$$S = (s_1 \cdots s_m)^T. \quad \text{(Equation 2)}$$

Here, superscript T in the Equations 1 and 2 represent matrix or vector transposition.

Relationship between beam intensities I of secondary electron beams 102_1*se* to 102_*mse* and detection signals S from electron detection device 140 can be expressed as follows:

$$S = (s_1 \cdots s_m)^T = RI = \begin{pmatrix} r_{11} & \cdots & \cdots & \cdots & r_{1m} \\ \vdots & \ddots & & & \vdots \\ \vdots & & r_{ij} & & \vdots \\ \vdots & & & \ddots & \vdots \\ r_{m1} & \cdots & \cdots & \cdots & r_{mm} \end{pmatrix} (b_1 \cdots b_m)^T \quad \text{(Equation 3)}$$

Here, R represents a responsivity matrix that shows a relationship between each detection signal $s_i$ from an $i^{th}$ detection element 140_*i* and beam intensities of m-number of secondary electron beams 102_1*se* to 102_*mse*. R comprises $r_{11}$ to $r_{mm}$ as its elements. Equation 3 shows that a detection signal from any one detection element can be expressed as a linear combination of beam intensities of all secondary electron beams. For example, a first detection signal $s_1$ can be expressed with a combination of beam intensities of m-number of secondary electron beams 102_1*se* to 102_*mse* as $$s_1 = r_{11} * b_1 + r_{12} * b_2 + \ldots + r_{1(m-1)} * b_{(m-1)} + r_{1m} * b_m.$$

A second detection signal $s_2$ can be expressed with a combination of beam intensities of m number of secondary electron beams 102_1*se* to 102_*mse* as $$s_1 = r_{21} * b_1 + r_{22} * b_2 + \ldots + r_{2(m-1)} * b_{(m-1)} = r_{2m} * b_m.$$

Similarly, an $i^{th}$ detection signal $s_i$ can be expressed with a combination of beam intensities of m number of secondary electron beams 102_1*se* to 102_*mse* as $$s_i = r_{i1} * b_1 + r_{i2} * b_2 + \ldots + r_{i(m-1)} * b_{(m-1)} + r_{im*bm}.$$

In a responsivity matrix R, a cross-talk contribution ratio $r_{ij}$ (where, i≠j) represents a ratio of a portion of a beam intensity $b_j$ of a $j^{th}$ secondary electron beam 102_*jse* incident on an $i^{th}$ detection element 140_*i* to a total beam intensity $b_j$ of the $j^{th}$ secondary electron beam 102_*jse*. A self-contribution ratio $r_{ii}$ represents a ratio of a portion of a beam intensity $b_i$ of an $i^{th}$ secondary electron beam 102_*ise* incident on an $i^{th}$ detection element 140_*i* to a total beam intensity $b_i$ of the $i^{th}$ secondary electron beam 102_*ise*. It will be understood that a self-contribution ratio $r_{ii}$ has a value of 1 and a cross-talk contribution ratio $r_{ij}$ (where, i≠j) has a value of 0 in an ideal scenario where no cross-talk occurs. Due to aberrations and imperfection of electron beam tool 40, secondary electron beams may however be defocused, which can result in cross-talk occurring. Therefore, it is usual that a value of a self-contribution ratio $r_{ii}$ does not amount to a value 1 and a cross-talk contribution ratio $r_{ij}$ (where, i≠j) is not equal to 0.

Beam intensities I of secondary electron beams 102_1*se* to 102_*mse* can be obtained by multiplying an inverse responsivity matrix $R^{-1}$ to both sides of Equation 3 and can be expressed as below:

$$I = (b_1 \cdots b_m)^T = inv\left\{\begin{pmatrix} r_{11} & \cdots & \cdots & \cdots & r_{1m} \\ \vdots & \ddots & & & \vdots \\ \vdots & & r_{ij} & & \vdots \\ \vdots & & & \ddots & \vdots \\ r_{m1} & \cdots & \cdots & \cdots & r_{mm} \end{pmatrix}\right\} S = R^{-1} S \quad \text{(Equation 4)}$$

By applying Equation 4, cross-talk contamination can be reduced, minimized, or removed from detection signals $s_1$ to $s_m$, and thus it is possible to obtain beam intensities $b_1$ to $b_m$ of secondary electron beams 102_1*se* to 102_*mse* without or with minimal cross-talk contamination.

Designing a responsivity matrix R invertible enables to calculate the beam intensities $b_1$ to $b_m$ of secondary electron beams 102_1*se* to 102_*mse* according to Equation 4. In some embodiments, a responsivity matrix R can be configured as invertible by properly configuring sizes, shapes, and, locations of detection elements with respect to spot grids of secondary electron beams projected onto a surface of electron detection device.

However, not every responsivity matrix R can be made invertible. Moreover, it can also be heavily time consuming to mathematically calculate the inverse responsivity matrix $R^{-1}$ even when the responsivity matrix R is invertible. Accordingly, reconstructing SEM images from detection signals $s_1$ to $s_m$ can result in time consuming computation process involving an enormous amount of data, which could make removing cross-talk contamination in real time difficult to achieve.

According to embodiments of the present disclosure, cross-talk reducer 430 can acquire a transform function from transform function provider 440. Here, a transform function can correspond to the inverse responsivity matrix $R^{-1}$ of Equation 4. In some embodiments, a transform function can be a transform matrix as expressed as $R^{-1}$ in Equation 4. In some embodiments, a transform function can be obtained by inferring elements of the transform function using a machine learning network. In some embodiments, a transform function can be determined with respect to a certain electron beam tool 40 or EBI system 100 because cross-talk contamination is specific to the tool or system itself rather than errors in operating the tool or system. Therefore, according to embodiments of the present disclosure, transform function provider 440 can pre-compute a transform function with images acquired from a certain tool 40 or system 100 and provide the pre-obtained transform function to cross-talk reducer 430 on demand. In some embodiments, a transform function obtained from transform function provider 440 can be stored in storage medium (not shown) and can be accessed by cross-talk reducer 430. In some embodiments, transform function provider 440 can update a transform function when new images are acquired from a tool 40 or system 100. In some embodiments, transform function provider 440 can update a transform function periodically because degrees or levels of defocusing due to defects inherent in a tool 40 or system 100 can change over time. Therefore, transform function provider 440 can provide a latest transform function to cross-talk reducer 430 or storage medium. Configurations and functions of transform function provider 440 will be explained in detail with respect to FIG. 5.

Referring back to FIG. 4, cross-talk reducer 430 may reduce, minimize, or remove cross-talk contamination from detection signal $s_1$ to $s_m$ by multiplying the detection signals $s_1$ to $s_m$ with a transform function as represented in Equation 4. In this way, cross-talk reducer 430 can obtain beam intensities $b_1$ to $b_m$ of secondary electron beams **102_1*se* to 102_*mse* without or with minimal cross-talk contamination. In some embodiments, cross-talk reducer 430 can be implemented as firmware or other software in an image enhancing apparatus 400**.

Image generator 450 can construct a plurality of images corresponding to a plurality of secondary electron beams **102_1*se* to 102_*mse* that are obtained by reducing, minimizing, or removing cross-talk contamination from detection signals $s_1$ to $s_m$, consistent with embodiments of the present disclosure. In some embodiments, a plurality of images constructed by image generator 450 can be images of a plurality of regions scanned by a plurality of probe spots (e.g., 102_1S, 102_2S, and, 102_3S) on sample 1 where corresponding secondary electron beams (e.g., 102_1*se*, 102_2*se*, and 102_3*se*) are generated. In some embodiments, image generator 450 can generate a plurality of images at once or sequentially according to embodiments of the present disclosure. In some embodiments, a plurality of images generated from image generator 450** can be cross-talk artefacts free images.

Figure 5:
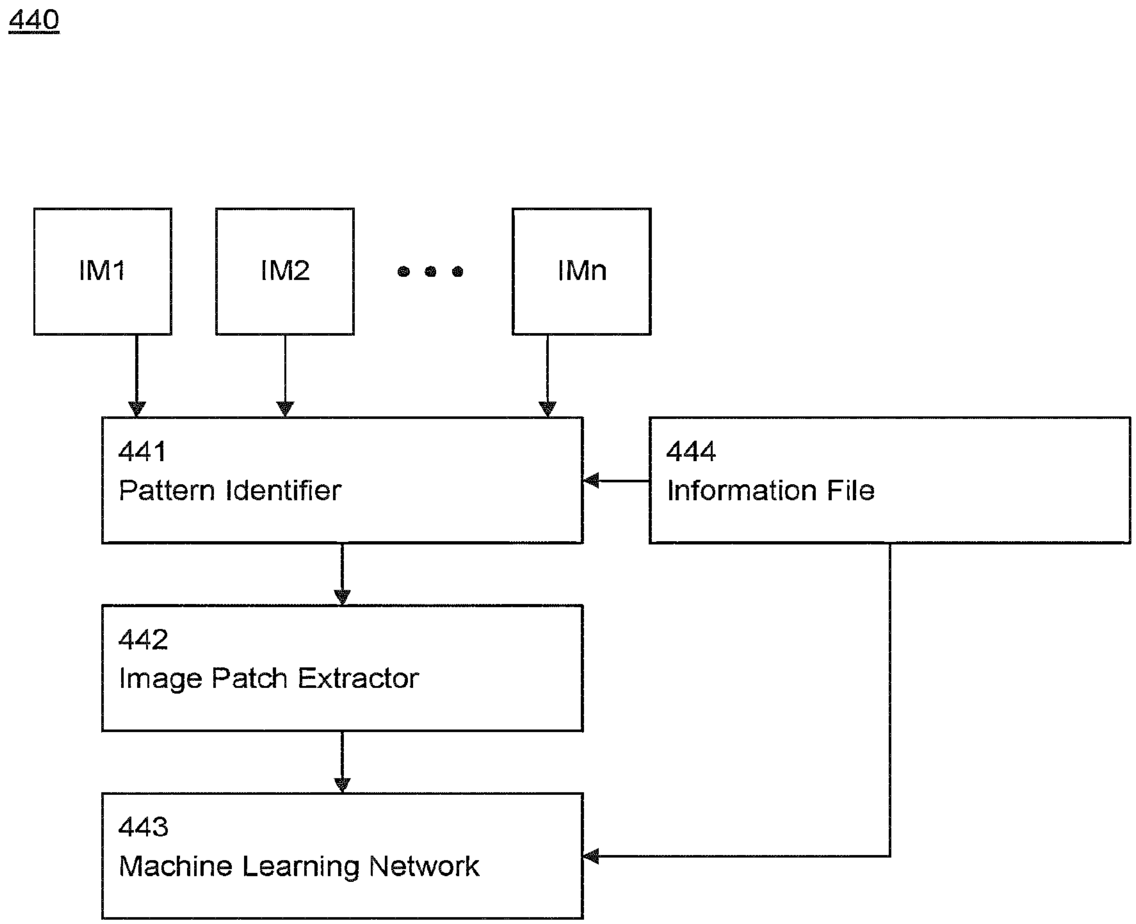
FIG. 5 is a block diagram of an exemplary transform function provider of the exemplary image enhancement apparatus of FIG. 1, consistent with embodiments of the present disclosure.

Reference is now made to FIG. 5, which illustrates a block diagram of an exemplary transform function provider 440 of the exemplary image enhancement apparatus 400 of FIG. 4, consistent with some embodiments of the present disclosure. As illustrated in FIG. 5, transform function provider 440 may include pattern identifier 441, image patch extractor 442, machine learning network 443, and information file 444.

Pattern identifier 441 can receive a plurality of images $IM_1$ to $IM_n$ acquired from target equipment such as, but not limited to, a tool 40 or system 100 for which a transform function can be determined. In some embodiments, a plurality of images $IM_1$ to $IM_n$ can include a plurality of images obtained by one scanning operation for any one sample and corresponding to a plurality of sub-regions of the sample. In some embodiments, a plurality of images $IM_1$ to $IM_n$ can include multiple sets of images obtained from a plurality of scanning operations for one sample. Here, each set of images may include a plurality of images obtained by a corresponding scanning operation and corresponding to a plurality of sub-regions of the sample. In some embodiments, a plurality of images $IM_1$ to $IM_n$ can include multiple sets of images obtained from a plurality of scanning operations for a plurality of samples. Here, each set of images may include a plurality of images obtained by a corresponding scanning operation and corresponding to a plurality of sub-regions of a corresponding sample.

According to embodiments of the present disclosure, pattern identifier 441 can identify patterns of inputted images $IM_1$ to $IM_n$. Pattern identifier 441 can identify which pattern is a main pattern of a certain image and which pattern is a ghost pattern originating from cross-talk contamination. In some embodiments, pattern identifier 441 can identify patterns by referring to information file 444 that can provide reference information of a certain image in determining main patterns and ghost patterns resulting from cross-talk contamination. In some embodiments, information file 444 can contain reference images showing main pattern(s) for inputted images $IM_1$ to $IM_n$. In some embodiments, pattern identifier 441 can determine shapes and locations of main patterns for inputted images $IM_1$ to $IM_n$. For example, information file 444 can contain a plurality of reference images corresponding to inputted images $IM_1$ to $IM_n$ and show what the corresponding inputted images $IM_1$ to $IM_n$ are intended to be if no cross-talk contamination had occurred. In some embodiments, information file 444 can contain ground truth images of sub-regions of samples corresponding to their inputted images $IM_1$ to $IM_n$. In some embodiments, reference images contained in information file 444 can be in Graphic Database System (GDS) format, Graphic Database System II (GDS II) format, an Open Artwork System Interchange Standard (OASIS) format, a Caltech Intermediate Format (CIF), etc. In some embodiments, reference images contained in information file 441 can comprise a wafer design layout of sub-regions of samples corresponding to their inputted images $IM_1$ to $IM_n$. The wafer design layout may be based on a pattern layout for constructing the wafer. The wafer design layout may correspond to one or more photolithography masks or reticles used to transfer features from the photolithography masks or reticles to a wafer, for example, sample 1. In some embodiments, an information file in GDS or OASIS, among others, may comprise feature information stored in a binary file format representing planar geometric shapes, text, and other information related to wafer design layout.

For illustration purposes and simplicity, a process of identifying patterns will be explained with respect to electron beam images of FIG. 3A-3C. For example, it is assumed that pattern identifier 441 receives a first image $IM_1$, as shown in FIG. 3C, generated based on a first detection signal $s_1$ of a first detection element 140_1 and a second image $IM_2$ (not shown) generated based on a second detection signal $s_2$ of a second detection element 140_2. In this example, information file 441 can contain a first reference image and a second reference image that correspond to the images shown in FIGS. 3A and 3B, and that correspond to images expected from the first detection element 140_1 and second detection element 140_2, absent cross-talk contamination. A first reference image shows what a sub-region of a sample 1 detected through a first detection element 140_1 is expected to look like absent cross-talk contamination, and a second reference image shows what a sub-region of a sample 1 detected through a second detection element 140_2 is expected to look like absent cross-talk contamination. In this example, pattern identifier 441 can identify a main pattern and a ghost pattern for a first image $IM_1$ referring to a first reference image and a second reference image. For example, pattern identifier 441 identifies, in a first image $IM_1$, a pattern A as a main pattern originating from secondary electron beam 102_1*se* and a pattern B as a ghost pattern originating from a neighboring secondary electron beam 102_2*se*. Similarly, pattern identifier 441 can identify, in a second image $IM_2$, a pattern B as a main pattern and a pattern A as a ghost pattern.

Figure 6:
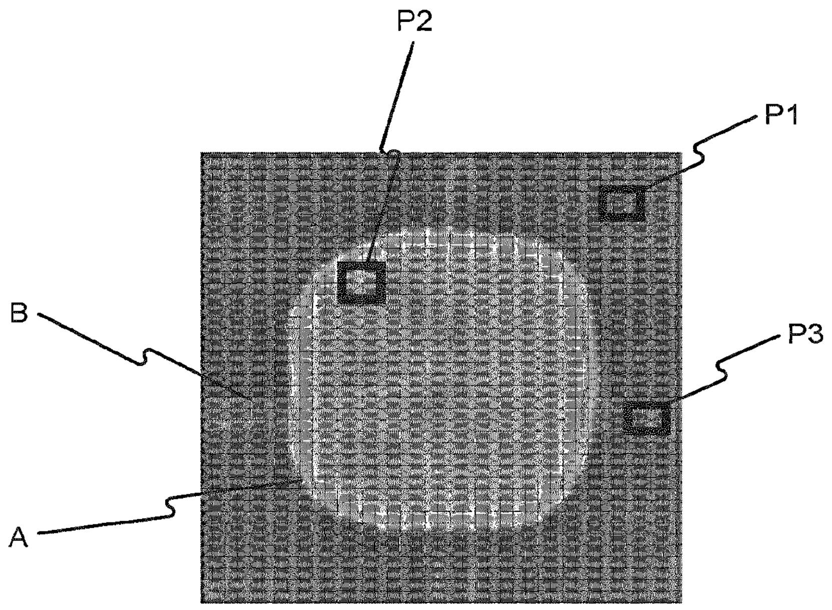
FIG. 6 is an example for extracting image patches from an electron beam image, consistent with embodiments of the present disclosure.

Referring back to FIG. 5, image patch extractor 442 can extract image patches from inputted images $IM_1$ to $IM_n$ based on the pattern information identified by pattern identifier 441, consistent with embodiments of the present disclosure. A process for extracting image patches from inputted images $IM_1$ to $IM_n$ will be explained with respect to a first image $IM_1$ as shown in FIG. 3C, as an example. As illustrated in FIG. 6, a first image contains a main pattern A and a ghost pattern B. In this example, image patch extractor 442 can extract three types of image patches such as, but not limited to, a background patch P1, a main pattern patch P2, and a ghost pattern patch P3. In some embodiments, a background patch P1 can be a part of a first image $IM_1$ and only includes an area that does not have features constituting a main pattern A nor a ghost pattern B. A main pattern patch P2 can be a part of a first image $IM_1$ and only includes an area that has features constituting a main pattern A but not a ghost pattern B. Similarly, a ghost pattern patch P3 can be a part of a first image $IM_1$ and only includes an area that has features constituting a ghost pattern B but not a main pattern A. In some embodiments, a plurality of background patches P1, a plurality of main pattern patches P2, and a plurality of ghost pattern patches P3 can be extracted from a first image $IM_1$. Similarly, one or more background patches, one or more main pattern patches, and one or more ghost pattern patches can be extracted from a second image $IM_2$ (not shown).

The intensity of a secondary electron beam may vary according to an external or internal structure of a scanned area of wafer. It is noted that a value for a detection signal, generally, may be constant or may not abruptly change over a background area that does not have features constituting patterns, such as patterns A and B, because a region of wafer corresponding to the background area is likely to have a uniform structure, material, shape, etc. Therefore, by extracting background patches P1 and other pattern patches P2 and P3 that include no more than one pattern, and by using them as inputs to machine learning network 443, computation data can be substantially reduced and thus cost and time efficiency can be improved when inferring a transform function with machine learning network 443. Inference accuracy for a transform function can also be improved. While extracting patches from an electron beam image is explained with respect an image having only two patterns as shown in FIG. 6, it is appreciated that embodiments of the present disclosure can be applied to scenarios where three or more images $IM_1$ to $IM_n$ are used and each of the three or more images $IM_1$ to $IM_n$ includes three or more patterns. If there are three or more patterns in an image generated based on a detection signal, it is also possible to extract three types of patches, such as a background patch P1, a main pattern patch P2, and a ghost pattern patch P3 (this example is not illustrated in a figure). If an image $IM_1$ contains a main pattern A, a first ghost pattern B1, and a second ghost pattern B2, a ghost pattern patch P3 can include two types of ghost pattern patches P31 and P32. For example, a first type of ghost pattern patch P31 can be a part of the image and only includes an area that has features constituting the first ghost pattern B1, but not the main pattern A and the second ghost pattern B2. In this way, even with the increasing number of patterns in an image, computation complexity can be reduced by using patches having no more than one pattern. In some embodiments, for better accuracy, areas where multiple patterns overlap can be extracted as patches. For example, when areas having no more than one pattern are limited in an image and therefore data for computation is in short, patches having two or more patterns can be used for the computation.

According to embodiments of the present disclosure, machine learning network 443 can be configured to obtain a transform function associated with a target equipment from which a plurality of images $IM_1$ to $IM_n$ are acquired. Machine learning network 443 can receive image patches P1, P2, and P3 extracted from image patch extractor 442 as its input for inferring a transform function, consistent with some embodiments of the present disclosure. In some embodiments, machine learning network 443 can obtain information, from the received image patches P1, P2, and P3, to be used for inferring a transform function. In some embodiments, the information to be used for inferring a transform function can include, but are not limited to, a location of an extracted image patch and a detection signal corresponding to the location of the extracted image patch.

Using a simplified example when only two primary electron beamlets such as a first and second electron beamlets 102_1 and 102_2 are used for scanning, how to select patches and how to obtain secondary electron beam intensities and detection signals corresponding to the selected patches will be explained. A first beamlet 102_1 and a second beamlet 102_2 can be used to scan a first and second probe spots 102_1S and 102_2S over the surface of sample 1. The first probe spot 102_1S and second probe spot 102_2S may correspond to a first detection element 140_1 and a second detection element 140_2, respectively. During scanning, each beamlet moves, relative to the sample 1, over the surface of the sample 1 along a certain path over time, preferably, according to a predetermined schedule. In some embodiments, the first beamlet 102_1 and the second beamlet 102_2 may be designed to move in parallel with each other within its corresponding probe spots 102_1S and 102_2S while scanning. Therefore, at a specific time point in a time period for scanning, the first beamlet 102_1 and the second beamlet 102_2 can respectively be directed to corresponding probe spots 102_1S and 102_2S. During a time period for scanning, on which location within a corresponding probe spot a beamlet will be incident at a certain time point can be predetermined and is known to the system.

During a time period for scanning a first probe spot 102_1S, a first secondary electron beam 102_1*se* can be emitted from the sample associated with the movement of the first beamlet 102_1. Therefore, beam intensity $b_1$ of a first secondary electron beam 102_1*se* can include beam intensity values (continuous or discrete) over a time period corresponding to movement of the first beamlet 102_1 on the first probe spot 102_1S during the same relative time period. The beam intensity value of beam intensity $b_1$ at a specific time can represent a beam intensity corresponding to the location on the surface of the sample 1 onto which the first beamlet 102_1 is directed at the specific time. In some embodiments, if a location within a probe spot is determined, a beam intensity of the location can be obtained by finding a beam intensity value at a time point corresponding to the location from the beam intensity such as $b_1$. It is understood that beam intensity $b_2$ of a secondary electron beam 102_2*se* and detection signals $s_1$ and $s_2$ corresponding to the first and second secondary electron beams 102_1*se* and 102_2_se_ can be represented in a similar way. For example, a first detection signal $s_1$ can include detection signal values (continuous or discrete) over a time period corresponding to the time period for scanning the first probe spot 102_1S and second probe spot 102_2S. The detection signal value of a first detection signal $s_1$ at a specific time can be a combination of a beam intensity value of beam intensity $b_1$ and of a beam intensity value of beam intensity $b_2$ corresponding to the relative location within its corresponding probe spots 102_1S and 102_2S at the specific time. In some embodiments, an extracted image patch may have a small size such that one beamlet can cover at a certain time to obtain a certain beam intensity value, which is invariable over the patch area, at the certain time.

According to embodiments of the present disclosure, machine learning network 443 can obtain a location of a background patch P1 in a first image $IM_1$ and, as explained above, a detection signal value corresponding to the location of the background patch P1. It is also known to machine learning network 443 that the detection signal at the background patch P1 is a sum of a part of a first secondary electron beam 102_1_se_ and a part of a second secondary electron beam 102_2_se_ corresponding to the location of the background patch P1. Here, the first secondary electron beam 102_1_se_ and second secondary electron beam 102_2_se_ at the location for the background patch P1 have the same intensities corresponding to a background area of a sample 1. In the same example, machine learning network 443 can obtain a location of a main pattern patch P2 in a first image $IM_1$ and a detection signal value corresponding to the location of the main pattern patch P2. It is also known to machine learning network 443 that the detection signal at the main pattern patch P2 is a sum of a part of a first secondary electron beam 102_1_se_ and a part of a second secondary electron beam 102_2_se_ corresponding to the location of the main pattern patch P2. Here, at the location for the main pattern patch P, the second secondary electron beam 102_2_se_ may have the intensity corresponding to the background area of a sample 1. Also, machine learning network 443 can obtain a location of a ghost pattern patch P3 in a first image $IM_1$ and a detection signal value corresponding to the location of the ghost pattern patch P3. It is also known to machine learning network 443 that the detection signal at the ghost pattern patch P2 is a sum of a part of a first secondary electron beam 102_1_sc_ and a part of a second secondary electron beam 102_2_se_ corresponding to the location of the ghost pattern patch P3. Here, at the location for the ghost pattern patch P3, the first secondary electron beam 102_1_se_ may have the intensity corresponding to a background area of a sample. If a secondary electron beam 102_1_se_ and 102_2_sc_ has a constant value over a background area of a sample 1, the number of variables to be used in inferring a transform function can be reduced.

In some embodiments, machine learning network 443 can be configured to learn elements of a transform function with unsupervised machine learning algorithm. For example, referring to Equation 4, machine learning network 443 can be configured to learn elements $r_{11}$ to $r_{mm}$ of a transform function (corresponding to $R^{-1}$) as well as elements $b_1$ to $b_m$ by using information obtained from image patches as input data and by putting conditions on the learning process. For the example above, a transform function may have four elements $r_{11}$ to $r_{22}$, a signal S may have two elements a first detection signal $s_1$ from a first detection element 140_1 and a second detection signal $s_2$ from a second detection element 140_2, and beam intensity I may have two elements $b_1$ and $b_2$ having the same value corresponding to a background area. Under these input data and conditions, machine learning network 443 can be configured to infer elements of a transform function and elements of beam intensity I. In some embodiments, machine learning network 443 can update the previously learned transform function and beam intensity by using subsequent image patches such as P2 and P3. In some embodiments, machine learning network 443 can generate a transform function if a condition for ending the learning process is satisfied. For example, the process can end if the number of iterations becomes equal to a certain number, or if the accuracy of the transform function reaches a certain level.

In some embodiments, machine learning network 443 can be configured to learn elements of a transform function with supervised machine learning algorithm. For example, referring to Equation 4, machine learning network 443 can be configured to learn elements $r_{11}$ to $r_{mm}$ of a transform function (corresponding to $R^{-1}$) under a condition that elements $b_1$ to $b_m$ are known to the machine learning network 443 using information obtained from image patches as input data. For the example above, a transform function may have four elements $r_{11}$ to $r_{22}$, a signal S may have two elements a first detection signal $s_1$ from a first detection element 140_1 and a second detection signal $s_2$ from a second detection element 140_2, and two elements $b_1$ and $b_2$ of beam intensity I are provided. Under these input and conditions, machine learning network 443 can be configured to infer elements of a transform function. In some embodiments, machine learning network 443 can update the previously learned transform function by using subsequent image patches such as P2 and P3 and beam intensity information. In some embodiments, an information file 444 may include beam intensity information over time corresponding to each image patches P1 to P3 and can be provided to machine learning network 443. In some embodiments, beam intensity information can be obtained from simulations, prior experiments, etc.

While a process performed by transform function provider 440 is explained with respect to images shown in FIGS. 3A-3C, it is appreciated that embodiments of the present disclosure can be applied to scenarios involving three or more images $IM_1$ to $IM_n$ are used and each image include two or more patterns. It will be noted that computation for obtaining a transform function becomes exponentially complicated as the number of images $IM_1$ to $IM_n$ and patterns included in the images increase. Therefore, pre-computing the transform function specific to a certain equipment and system enables to generate reconstructed images from detection signals in real time.

Figure 7:
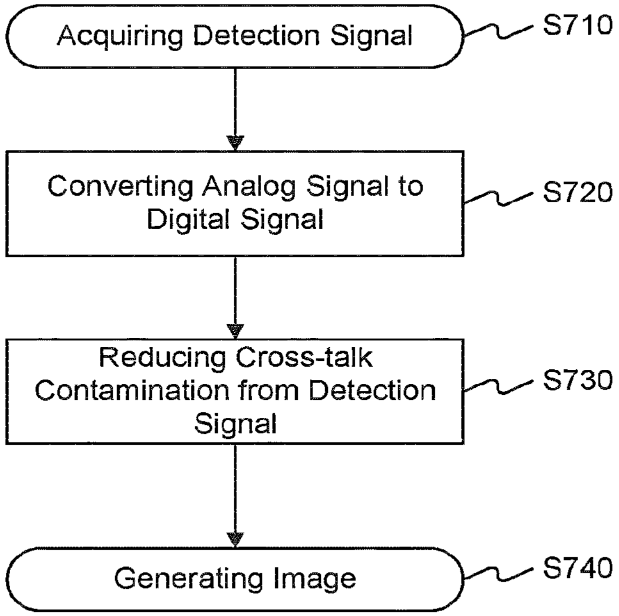
FIG. 7 is a process flowchart representing an exemplary method for enhancing an image in a multi-beam inspection system, consistent with embodiments of the present disclosure.

FIG. 7 is a process flowchart representing an exemplary method for enhancing an image in a multi-beam inspection system (e.g., 100 of FIG. 1), consistent with embodiments of the present disclosure. For illustrative purpose, a method for enhancing an image will be described together with electron beam tool 40 of FIG. 2.

In step S710, a detection signal can be acquired. Step S710 can be performed by, for example, a detection signal acquirer 410, among others. In some embodiments, a detection signal can be acquired from electron detection device 140 of electron beam tool 40. As illustrated in FIG. 2, electron detection device 140 can comprise a plurality of detection elements. Although FIG. 2 shows that electron detection device 140 includes three detection elements 140_1, 140_2, and 140_3 arranged in one line, it is appreciated that electron detection device 140 may include any number of detection elements of any arrangement. For example, electron detection device 140 can have m-number of detection elements that are arranged in a matrix with k-number of rows and n-number of columns. Here, "k" and "n" can be natural numbers equal to or greater than 1 and "m" can be a natural number equal to or greater than 2. Accordingly, in some embodiments, m-number of detection signals $s_1$ to $s_m$ corresponding to m-number of detection elements 140_1 to 140_*m* can be acquired. It is appreciated that the acquired detection signals $s_1$ to $s_m$ can be subject to various signal processing, for example, amplification, noise cancellation, and the like. Detection signals $s_1$ to $s_m$ acquired from electron detection device 140 can be analog signals.

In step S720, acquired analog detection signals may be converted to digital detection signals $s_1$ to $s_m$. Step S720 can be performed by, for example, an analog to digital converter 420, among others. In some embodiments, analog detection signals may be converted to digital detection signals $s_1$ to $s_m$ to obtain a distribution of the detected secondary electrons. The electron distribution data collected during a detection time window, in combination with corresponding scan path data of each of primary beamlets 102_1, 102_2, and 102_3 incident on the wafer surface, can be used to generate images of the wafer structures under inspection.

As discussed above, detection signals $s_1$ to $s_m$ may comprise cross-talk signals in addition to a corresponding intended signal. In other words, detection signal $s_1$ to $s_m$ detected from a corresponding detection element 140_1 to 140_*m* can comprise an intended signal originating from a corresponding secondary electron beam and cross-talk signals originating from secondary electron beams other than the intended secondary electron beam. Therefore, in step S730, cross-talk contamination can be reduced, minimized, or removed from detection signal $s_1$ to $s_m$. Step S730 can be performed by, for example, a cross-talk reducer 430, among others. According to embodiments of the present disclosure, cross-talk contamination can be reduced from detection signal $s_1$ to $s_m$ by using a transform function, which can be obtained, for example, by a process illustrated in FIG. 8 and performed by transform function provider 440 of FIG. 5. The principle for reducing cross-talk contamination from detection signal $s_1$ to $s_m$ has been explained with respect with above Equations 1 to 4 and therefore will be omitted here.

According to embodiments of the present disclosure, a transform function can correspond to the inverse responsivity matrix $R^{-1}$ of Equation 4. In some embodiments, cross-talk contamination can be reduced or removed from detection signal $s_1$ to $s_m$ by multiplying the detection signals $s_1$ to $s_m$ with a transform function as represented in Equation 4. In this way, beam intensities $b_1$ to $b_m$ of secondary electron beams 102_1*se* to 102_*mse* without or with minimal cross-talk contamination can be obtained.

In step S740, a plurality of images corresponding to a plurality of secondary electron beams 102_1*se* to 102_*mse* that are obtained by reducing, minimizing, or removing cross-talk contamination from detection signals $s_1$ to $s_m$ can be generated, consistent with embodiments of the present disclosure. Step S740 can be performed by, for example, image generator 440, among others. In some embodiments, the generated plurality of images can be images of a plurality of regions scanned by a plurality of probe spots (e.g., 102_1S, 102_2S, and, 102_3S) on sample 1 where corresponding secondary electron beams (e.g., 102_1*se*, 102_2*se*, and 102_3*se*) are generated. A plurality of images can be generated at once or sequentially according to embodiments of the present disclosure. In some embodiments, the generated plurality of images can be cross-talk artefacts free images.

Although the present disclosure has been described in connection with embodiments where cross-talk contamination is reduced or removed from detection signals, it will be appreciated that cross-talk contamination can also be reduced or removed from images generated based on the detection signals according to embodiments of the present disclosure. For example, a plurality of images can be generated based on the detection signals $s_1$ to $s_m$ detected from corresponding detection elements 140_1 to 140_*m* and each of the plurality of images can comprise an intended pattern originating from a corresponding secondary electron beam and ghost patterns originating from secondary electron beams other than the intended secondary electron beam. In this example, cross-talk contamination such as the ghost patterns can be reduced or removed from the plurality of images based on a transform function. In some embodiments, a transform function, which can be obtained, for example, by a process illustrated in FIG. 8 and performed by a transform function provider 440 of FIG. 5, can be modified based on a converting relationship between the detection signal and pixel values of the image, and the modified transform function can be used to reduce or remove the ghost patterns from the image. In some embodiments, a transform function can be obtained by a similar process to the one illustrated in FIG. 8 such that the transform function can be directly applied to the image. In some embodiments, a machine learning network can train the transform function in a form to be directly applied to the image, for example, pixel values of the image to reduce or remove cross-talk contamination. Here, the transform function can still be based on a relationship between detection signals and beam intensities of secondary electron beams. In some embodiments, a method for enhancing an image can comprise acquiring a first image from a detector of a multi-beam inspection system, wherein the first image is generated based on a first detection signal from a first region of the detector on which electrons of a first secondary electron beam and of a second secondary electron beam are incident, and reducing, from the first image, cross-talk image originating from the second secondary electron beam based on a relationship between the first detection signal and beam intensities associated with the first secondary electron beam and the second secondary electron beam.

Figure 8:
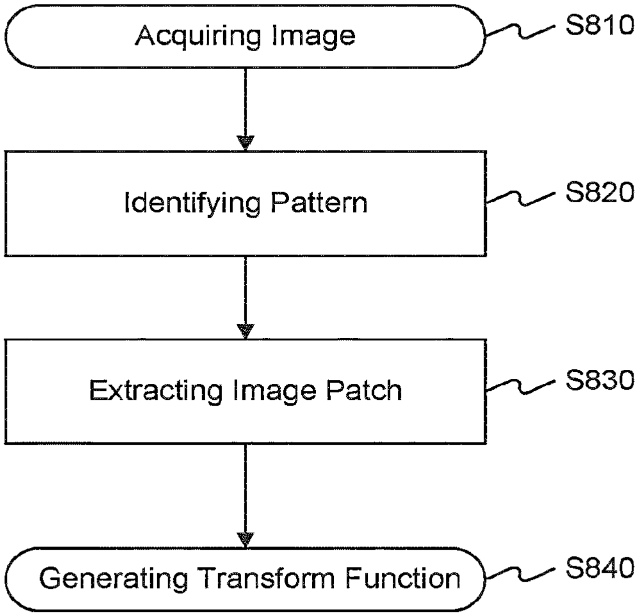
FIG. 8 is a process flowchart representing an exemplary method for generating a transform function for reducing cross-talk contamination from electron beam detection signals, consistent with embodiments of the present disclosure.

FIG. 8 is a process flowchart representing an exemplary method for generating a transform function for reducing cross-talk contamination from electron beam detection signals, consistent with some embodiments of the present disclosure. In some embodiments, a transform function generated by a process of FIG. 8 can be used at step S730 of FIG. 7.

In step S810, a plurality of images $IM_1$ to $IM_n$ can be acquired from target equipment such as, but not limited to, a tool 40 or system 100 for which a transform function can be determined. Step S810 can be performed by, for example, pattern identifier 441, among others. In some embodiments, a plurality of images $IM_1$ to $IM_n$ can include a plurality of images obtained by one scanning operation for any one sample and corresponding to a plurality of sub-regions of the sample. In some embodiments, a plurality of images $IM_1$ to $IM_n$ can include multiple sets of images obtained from a plurality of scanning operations for one sample. Here, each set of images may include a plurality of images obtained by a corresponding scanning operation and corresponding to a plurality of sub-regions of the sample. In some embodiments, a plurality of images $IM_1$ to $IM_n$ can include multiple sets of images obtained from a plurality of scanning operations for a plurality of samples. Here, each set of images may include a plurality of images obtained by a corresponding scanning operation and corresponding to a plurality of sub-regions of a corresponding sample.

According to embodiments of the present disclosure, in step S820, patterns of inputted images $IM_1$ to $IM_n$ can be identified. Step S820 can be performed by, for example, pattern identifier 441, among others. Which pattern is a main pattern of a certain image and which pattern is a ghost pattern originating from cross-talk contamination can be determined. In some embodiments, patterns can be identified by referring to information file (e.g. 444 of FIG. 4) that can provide reference information of a certain image in determining main patterns and ghost patterns resulting from cross-talk contamination. In some embodiments, information file 444 can contain images showing main pattern(s) for inputted images $IM_1$ to $IM_n$. In some embodiments, shapes and locations of main patterns for inputted images $IM_1$ to $IM_n$ can be determined. For example, information file 444 can contain a plurality of images corresponding to inputted images $IM_1$ to $IM_n$ and show what the corresponding inputted images $IM_1$ to $IM_n$ are intended to be if no cross-talk contamination had occurred. In some embodiments, information file 444 can contain ground truth images of sub-regions of samples corresponding to their inputted images $IM_1$ to $IM_n$. In some embodiments, images contained in information file 444 can be in Graphic Database System (GDS) format, Graphic Database System II (GDS II) format, an Open Artwork System Interchange Standard (OASIS) format, a Caltech Intermediate Format (CIF), etc. In some embodiments, images contained in information file 441 can comprise a wafer design layout of sub-regions of samples corresponding to their inputted images $IM_1$ to $IM_n$. The wafer design layout may be based on a pattern layout for constructing the wafer. The wafer design layout may correspond to one or more photolithography masks or reticles used to transfer features from the photolithography masks or reticles to a wafer, for example, sample 1. In some embodiments, an information file in GDS or OASIS, among others, may comprise feature information stored in a binary file format representing planar geometric shapes, text, and other information related to wafer design layout.

For illustration purposes and simplicity, a process of step S820 will be explained with respect to electron beam images of FIG. 3A-3C. For example, it is assumed that pattern identifier 441 receives a first image $IM_1$, as shown in FIG. 3C, generated based on a first detection signal $s_1$ of a first detection element 140_1 and a second image $IM_2$ (not shown) generated based on a second detection signal $s_2$ of a second detection element 140_2. In this example, information file 441 can contain a first reference image and a second reference image that correspond to the images shown in FIGS. 3A and 3B, and that correspond to images expected from the first detection element 140_1 and second detection element 140_2, absent cross-talk contamination. A first reference image shows what a sub-region of a sample 1 detected through a first detection element 140_1 is expected to look like absent cross-talk contamination, and a second reference image shows what a sub-region of a sample 1 detected through a second detection element 140_2 is expected to look like absent cross-talk contamination. In this example, a main pattern and a ghost pattern for a first image $IM_1$ can be determined by referring to a first reference image and a second reference image. For example, in a first image $IM_1$, a pattern A can be identified as a main pattern originating from a secondary electron beam 102_1*se* and a pattern B can be identified as a ghost pattern originating from a neighboring secondary electron beam 102_2*se*. Similarly, in a second image $IM_2$, a pattern B can be identified as a main pattern and a pattern A can be identified as a ghost pattern.

In step S830, image patches can be extracted from inputted images $IM_1$ to $IM_n$ based on the pattern information identified at step S820, consistent with embodiments of the present disclosure. Step S830 can be performed by, for example, image patch extractor 442, among others. A process of step S830 will be explained with respect to a first image $IM_1$ as shown in FIG. 3C, as an example. As illustrated in FIG. 6, a first image contains a main pattern A and a ghost pattern B. In this example, three types of image patches such as, but not limited to, a background patch P1, a main pattern patch P2, and a ghost pattern patch P3 can be extracted. In some embodiments, a background patch P1 can be a part of a first image $IM_1$ and only includes an area that does not have features constituting a main pattern A nor a ghost pattern B. A main pattern patch P2 can be a part of a first image $IM_1$ and only includes an area that has features constituting a main pattern A but not a ghost pattern B. Similarly, a ghost pattern patch P3 can be a part of a first image $IM_1$ and only includes an area that has features constituting a ghost pattern B but not a main pattern A. In some embodiments, a plurality of background patches P1, a plurality of main pattern patches P2, and a plurality of ghost pattern patches P3 can be extracted from a first image $IM_1$. Similarly, one or more background patches, one or more main pattern patches, and one or more ghost pattern patches can be extracted from a second image $IM_2$ (not shown).

While extracting patches from an electron beam image is explained with respect an image having only two patterns as shown in FIG. 6, it is appreciated that embodiments of the present disclosure can be applied to scenarios involving three or more images $IM_1$ to $IM_n$ are used and each image includes three or more patterns. If there are three or more patterns in an image generated based on detection signal, it is also possible to extract three types of patches, such as a background patch P1, a main pattern patch P2, and a ghost pattern patch P3. If an image $IM_1$ contains a main pattern A, a first ghost pattern B1, and a second ghost pattern B2, a ghost pattern patch P3 can include two types of ghost pattern patches P31 and P32. For example, a first type of ghost pattern patch P31 can be a part of the image and only includes an area that has features constituting the first ghost pattern B1, but not the main pattern A and the second ghost pattern B2. In this way, even with the increasing number of patterns in an image, computation complexity can be reduced by using patches having no more than one pattern. In some embodiments, for better accuracy, areas where multiple patterns overlap can be extracted as patches. For example, when areas having no more than one pattern are limited in an image and therefore data for computation is in short, patches having two or more patterns can be used for the computation.

In step S840, a transform function associated with a target equipment from which a plurality of images $IM_1$ to $IM_n$ are acquired can be generated. Step S840 can be performed by, for example, machine learning network 443 of FIG. 5, among others. A transform function can be inferred by receiving image patches P1, P2, and P3 extracted from step S830 as its input, consistent with some embodiments of the present disclosure. In some embodiments, information to be used for inferring a transform function can be obtained from the received image patches P1, P2, and P3. In some embodiments, the information to be used for inferring a transform function can include, but are not limited to, a location of an extracted image patch and a detection signal corresponding to the location of the extracted image patch.

For simplicity, a process of step S830 will be explained with an example when only two primary electron beamlets such as a first and electron beamlets 102_1 and 102_2 are used for scanning. As discussed above, it is understood that, if a relative location within a probe spot or a corresponding detection element is determined, a beam intensity and a detection signal of the relative location can be determined by finding a beam intensity value and detection signal value at a time point corresponding to the relative location from the beam intensity such as $b_1$ and a detection signal such as $s_1$. According to embodiments of the present disclosure, a location of a background patch P1 in a first image $IM_1$ and, as explained above, a detection signal value corresponding to the location of the background patch P1 can be obtained. Here the detection signal at the background patch P1 may be a sum of a part of a first secondary electron beam 102_1*se* and a part of a second secondary electron beam 102_2*se* corresponding to the location of the background patch P1. In some embodiments, the first secondary electron beam 102_1*se* and second secondary electron beam 102_2*se* at the location for the background patch P1 may have the same intensities corresponding to a background area of sample 1. In the same example, a location of a main pattern patch P2 in a first image $IM_1$ and a detection signal value corresponding to the location of the main pattern patch P2 can be obtained. Here, the detection signal at the main pattern patch P2 may be a sum of a part of a first secondary electron beam 102_1*se* and a part of a second secondary electron beam 102_2*se* corresponding to the location of the main pattern patch P2. In some embodiments, at the location for the main pattern patch P, the second secondary electron beam 102_2*se* may have the intensity corresponding to the background area of a sample 1. A location of a ghost pattern patch P3 in a first image $IM_1$ and a detection signal value corresponding to the location of the ghost pattern patch P3 can also be obtained. Here, the detection signal at the ghost pattern patch P2 may be a sum of a part of a first secondary electron beam 102_1*se* and a part of a second secondary electron beam 102_2*se* corresponding to the location of the ghost pattern patch P3. In some embodiments, at the location for the ghost pattern patch P3, the first secondary electron beam 102_1*se* may have the intensity corresponding to a background area of a sample. If a secondary electron beam 102_1*se* and 102_2*se* has a constant value over a background area of a sample 1, the number of variables to be used in inferring a transform function can be reduced.

In some embodiments, a transform function can be learned with unsupervised machine learning algorithm. For example, referring to Equation 4, elements $r_{11}$ to $r_{mm}$ of a transform function (corresponding to $R^{-1}$) as well as elements $b_1$ to $b_m$ can be inferred by using information obtained from image patches as input data and by putting conditions on the learning process. For the example above, a transform function may have four elements $r_{11}$ to $r_{22}$, a signal S may have two elements a first detection signal $s_1$ from a first detection element 140_1 and a second detection signal $s_2$ from a second detection element 140_2, and beam intensity I may have two elements $b_1$ and $b_2$ having the same value corresponding to a background area. Under these input data and conditions, elements of a transform function and elements of beam intensity I can be inferred with a machine learning algorithm. In some embodiments, the previously learned transform function and beam intensity can be updated by using subsequent image patches such as P2 and P3. In some embodiments, a transform function can be generated if a condition for ending the learning process is satisfied. For example, the process can end if the number of iterations becomes equal to a certain number, or if the accuracy of the transform function reaches a certain level.

In some embodiments, a transform function can be learned with supervised machine learning algorithm. For example, referring to Equation 4, elements $r_{11}$ to $r_{mm}$ of a transform function (corresponding to $R^{-1}$) can be inferred, under a condition that elements $b_1$ to $b_m$ are known to the machine learning algorithm, using information obtained from image patches as input data. For the example above, a transform function may have four elements $r_{11}$ to $r_{22}$, a signal S may have two elements a first detection signal $s_1$ from a first detection element 140_1 and a second detection signal $s_2$ from a second detection element 140_2, and two elements $b_1$ and $b_2$ of beam intensity I are provided. Under these input and conditions, machine learning network 443 can be configured to infer elements of a transform function. In some embodiments, the previously learned transform function can be updated by using subsequent image patches such as P2 and P3 and beam intensity information. In some embodiments, beam intensity information over time corresponding to each image patches P1 to P3 can be stored in a storage medium and can be provided to machine learning algorithm. In some embodiments, beam intensity information can be obtained from simulations, prior experiments, etc.

While a process of FIG. 8 is explained with respect to images shown in FIGS. 3A-3C, it is appreciated that embodiments of the present disclosure can be applied to scenarios involving three or more images $IM_1$ to $IM_n$ are used and each image include two or more patterns. It will be noted that computation for obtaining a transform function becomes exponentially complicated as the number of images $IM_1$ to $IM_n$ and patterns included in the images increase. Therefore, pre-computing the transform function specific to a certain equipment and system enables to generate reconstructed images from detection signals in real time.

In some embodiments, a transform function can be determined with respect to a certain electron beam tool 40 or EBI system 100 because cross-talk contamination is specific to the tool or system itself rather than errors in operating the tool or system. Therefore, according to embodiments of the present disclosure, transform function can be pre-computed with images acquired from a certain tool 40 or system 100 and provided to reconstruct images from detection signals on demand. In some embodiments, a transform function can be stored in storage medium (not shown) and can be accessed when needed. In some embodiments, a transform function can be updated when new images are acquired from a tool 40 or system 100. In some embodiments, a transform function can be updated periodically because degrees or levels of defocusing due to defects inherent a tool 40 or system 100 can change over time. Therefore, a latest transform function can be used to reduce or remove cross-talk contamination.

The embodiments may further be described using the following clauses:

1. A method for enhancing an image, the method comprising:
   - acquiring a first image signal of a plurality of image signals from a detector of a multi-beam inspection system, wherein the first image signal corresponds to a detected signal from a first region of the detector on which electrons of a first secondary electron beam and of a second secondary electron beam are incident;

reducing, from the first image signal, cross-talk contamination originating from the second secondary electron beam using a relationship between the first image signal and beam intensities associated with the first secondary electron beam and the second secondary electron beam; and generating a first image corresponding to the first secondary electron beam after the reduction.

2. The method of clause 1, wherein a third secondary electron beam is further incident on the first region of the detector, and wherein reducing cross-talk contamination comprises reducing, from the first image signal, cross-talk contamination originating from the second secondary electron beam and the third secondary electron beam using a relationship between the first image signal and beam intensities associated with the first secondary electron beam, the second secondary electron beam, and the third secondary electron beam.

3. The method of clause 1 or 2, wherein the relationship is in a form of a transform matrix and reducing cross-talk contamination is performed by multiplying the transform matrix to the first image signal.

4. The method of any one of clauses 1-3, wherein reducing the cross-talk contamination is performed in real time.

5. The method of any one of clauses 1-4, further comprising:

before acquiring the first image, obtaining the relationship based on a plurality of previous images acquired by the multi-beam inspection system.

6. The method of clause 5, wherein obtaining the relationship further comprises:

identifying an intended pattern and an unintended pattern in each of the plurality of previous images;

extracting, from the each of the plurality of images, a first patch covering an area outside of the intended pattern and the unintended pattern, a second patch covering the intended pattern, and a third patch covering the unintended pattern; and producing the relationship using a machine learning network based on the first patch, the second patch, and the third patch.

7. The method of clause 6, wherein identifying an intended pattern and an unintended pattern is performed by using reference images containing information for determining intended patterns for the plurality of previous images.

8. The method of clause 7, wherein the reference images are in Graphic Database System (GDS) format, Graphic Database System II (GDS II) format, Open Artwork System Interchange Standard (OASIS) format, or Caltech Intermediate Format (CIF).

9. The method of any one of clauses 6-8, wherein the unintended pattern includes a plurality of unintended patterns.

10. The method of any one of clauses 1-9, wherein a portion of electrons of the second secondary electron beam is incident on the first region of the detector.

11. The method of any one of clauses 1-10, further comprising:

acquiring a second image signal of the plurality of image signals, wherein the second image signal corresponds to a detected signal from a second region of the detector on which electrons of the first secondary electron beam and the second secondary electron beam are incident;

reducing, from the second image signal, cross-talk contamination originating from the first secondary electron beam using a relationship between the second image signal and the beam intensities associated with the first secondary electron beam and the second secondary electron beam; and generating a second image corresponding to the second secondary electron beam after the reduction.

12. An image enhancing apparatus comprising:

a memory storing a set of instructions; and at least one processor configured to execute the set of instructions to cause the apparatus to perform:

acquiring a first image signal of a plurality of image signals from a detector of a multi-beam inspection system, wherein the first image signal corresponds to a detected signal from a first region of the detector on which electrons of a first secondary electron beam and of a second secondary electron beam are incident; reducing, from the first image signal, cross-talk contamination originating from the second secondary electron beam using a relationship between the first image signal and beam intensities associated with the first secondary electron beam and the second secondary electron beam; and generating a first image corresponding to the first secondary electron beam after the reduction.

13. The apparatus of clause 12, wherein a third secondary electron beam is further incident on the first region of the detector, and wherein reducing cross-talk contamination comprises reducing, from the first image signal, cross-talk contamination originating from the second secondary electron beam and the third secondary electron beam using a relationship between the first image signal and beam intensities associated with the first secondary electron beam, the second secondary electron beam, and the third secondary electron beam.

14. The apparatus of clause 12 or 13, wherein the relationship is in a form of a transform matrix and reducing cross-talk contamination is performed by multiplying the transform matrix to the first image signal.

15. The apparatus of any one of clauses 12-14, wherein reducing the cross-talk contamination is performed in real time.

16. The apparatus of any one of clauses 12-15, wherein, before acquiring the first image, the at least one processor is configured to execute the set of instructions to cause the apparatus to further perform:

obtaining the relationship based on a plurality of previous images acquired by the multi-beam inspection system.

17. The apparatus of clause 16, wherein obtaining the relationship further comprises:

identifying an intended pattern and an unintended pattern in each of the plurality of previous images;

extracting, from the each of the plurality of images, a first patch covering an area outside of the intended pattern and the unintended pattern, a second patch covering the intended pattern, and a third patch covering the unintended pattern; and producing the relationship using a machine learning network based on the first patch, the second patch, and the third patch.

18. The apparatus of clause 17, wherein identifying an intended pattern and an unintended pattern is performed by using reference images containing information for determining intended patterns for the plurality of previous images.

19. The apparatus of clause 18, wherein the reference images are in Graphic Database System (GDS) format, Graphic Database System II (GDS II) format, Open Artwork System Interchange Standard (OASIS) format, or Caltech Intermediate Format (CIF).

20. The apparatus of any one of clauses 16-19, wherein the unintended pattern includes a plurality of unintended patterns.

21. The apparatus of any one of clauses 12-20, wherein a portion of electrons of the second secondary electron beam is incident on the first region of the detector.

22. The apparatus of any one of clauses 12-21, wherein the at least one processor is configured to execute the set of instructions to cause the apparatus to further perform:

acquiring a second image signal of the plurality of image signals, wherein the second image signal corresponds to a detected signal from a second region of the detector on which electrons of the first secondary electron beam and the second secondary electron beam are incident;

reducing, from the second image signal, cross-talk contamination originating from the first secondary electron beam using a relationship between the second image signal and the beam intensities associated with the first secondary electron beam and the second secondary electron beam; and generating a second image corresponding to the second secondary electron beam after the reduction.

23. A non-transitory computer readable medium that stores a set of instructions that is executable by at least one processor of a computing device to cause perform a method for enhancing an image, the method comprising:

acquiring a first image signal of a plurality of image signals from a detector of a multi-beam inspection system, wherein the first image signal corresponds to a detected signal from a first region of the detector on which electrons of a first secondary electron beam and of a second secondary electron beam are incident;

reducing, from the first image signal, cross-talk contamination originating from the second secondary electron beam using a relationship between the first image signal and beam intensities associated with the first secondary electron beam and the second secondary electron beam; and generating a first image corresponding to the first secondary electron beam after the reduction.

24. The computer readable medium of clause 23, wherein a third secondary electron beam is further incident on the first region of the detector, and wherein reducing cross-talk contamination comprises reducing, from the first image signal, cross-talk contamination originating from the second secondary electron beam and the third secondary electron beam using a relationship between the first image signal and beam intensities associated with the first secondary electron beam, the second secondary electron beam, and the third secondary electron beam.

25. The computer readable medium of clause 23 or 24, wherein the relationship is in a form of a transform matrix and reducing cross-talk contamination is performed by multiplying the transform matrix to the first image signal.

26. The computer readable medium of any one of clauses 23-25, wherein reducing the cross-talk contamination is performed in real time.

27. The computer readable medium of any one of clauses 23-26, wherein, before acquiring the first image, the set of instructions that is executable by at least one processor of the computing device to cause the computing device to further perform:

obtaining the relationship based on a plurality of previous images acquired by the multi-beam inspection system.

28. The computer readable medium of clause 27, wherein obtaining the relationship further comprises:

identifying an intended pattern and an unintended pattern in each of the plurality of previous images; extracting, from the each of the plurality of images, a first patch covering an area outside of the intended pattern and the unintended pattern, a second patch covering the intended pattern, and a third patch covering the unintended pattern; and producing the relationship using a machine learning network based on the first patch, the second patch, and the third patch.

29. The computer readable medium of clause 28, wherein identifying an intended pattern and an unintended pattern is performed by using reference images containing information for determining intended patterns for the plurality of previous images.

30. The computer readable medium of clause 29, wherein the reference images are in Graphic Database System (GDS) format, Graphic Database System II (GDS II) format, Open Artwork System Interchange Standard (OASIS) format, or Caltech Intermediate Format (CIF).

31. The computer readable medium of any one of clauses 28-30, wherein the unintended pattern includes a plurality of unintended patterns.

32. The computer readable medium of any one of clauses 23-31, wherein a portion of electrons of the second secondary electron beam is incident on the first region of the detector.

33. The computer readable medium of any one of clauses 23-32, wherein the set of instructions that is executable by at least one processor of the computing device to cause the computing device to further perform:

acquiring a second image signal of the plurality of image signals, wherein the second image signal corresponds to a detected signal from a second region of the detector on which electrons of the first secondary electron beam and the second secondary electron beam are incident;

reducing, from the second image signal, cross-talk contamination originating from the first secondary electron beam using a relationship between the second image signal and the beam intensities associated with the first secondary electron beam and the second secondary electron beam; and generating a second image corresponding to the second secondary electron beam after the reduction.

34. A method for reducing cross-talk contamination in a multi-beam inspection system, the method comprising:

acquiring a first image and a second image of a first area and a second area on a sample respectively by a multi-beam inspection system, wherein the first image is generated based on a first detection signal from a first detection region of the multi-beam inspection system and the second image is generated based on a second detection signal from a second detection region of the multi-beam inspection system;

determining a main pattern of the first image originating from a first secondary electron beam by using a first reference image corresponding to the first area;

determining whether the first image includes a ghost pattern originating from a second secondary electron beam by using a second reference image corresponding to the second area;

determining a relationship between the first detection signal and beam intensities of the first secondary electron beam and the second secondary electron beam; and reducing cross-talk contamination from a third detection signal from the first detection region based on the determined relationship.

35. The method of clause 34, wherein reducing the cross-talk contamination is performed in real time after acquiring the third detection signal.

36. The method of clause 34 or 35, wherein determining the relationship is performed based on analyzing image patches of the first image, wherein the image patches includes a first image patch covering an area outside of the main pattern and the ghost pattern, a second image patch covering the main pattern, and a third image patch covering the ghost pattern.

37. A method for enhancing an image, the method comprising:

acquiring a first image from a detector of a multi-beam inspection system, wherein the first image is generated based on a first detection signal from a first region of the detector on which electrons of a first secondary electron beam and of a second secondary electron beam are incident; and reducing, from the first image, cross-talk image originating from the second secondary electron beam based on a relationship between the first detection signal and beam intensities associated with the first secondary electron beam and the second secondary electron beam.

38. The method of clause 37, wherein the relationship is obtained by:

acquiring a first previous image and a second previous image acquired by the multi-beam inspection system;

identifying an intended pattern and an unintended pattern in each of the first and second previous images based on reference images containing information for determining intended patterns for the first and second previous images;

extracting, from the each of the first and second previous images, a first patch covering an area outside of the intended pattern and the unintended pattern, a second patch covering the intended pattern, and a third patch covering the unintended pattern; and producing the relationship using a machine learning network based on the first patch, the second patch, and the third patch.

39. The method of clause 38, wherein the reference images are in Graphic Database System (GDS) format. Graphic Database System II (GDS II) format, Open Artwork System Interchange Standard (OASIS) format, or Caltech Intermediate Format (CIF).

A non-transitory computer readable medium may be provided that stores instructions for a processor of a controller (e.g., controller 50 of FIG. 1) to carry out image inspection, image acquisition, stage positioning, beam focusing, electric field adjustment, beam bending, condenser lens adjusting, activating charged-particle source, beam deflecting, etc. Common forms of non-transitory media include, for example, a floppy disk, a flexible disk, hard disk, solid state drive, magnetic tape, or any other magnetic data storage medium, a Compact Disc Read Only Memory (CD-ROM), any other optical data storage medium, any physical medium with patterns of holes, a Random Access Memory (RAM), a Programmable Read Only Memory (PROM), and Erasable Programmable Read Only Memory (EPROM), a FLASH-EPROM or any other flash memory, Non-Volatile Random Access Memory (NVRAM), a cache, a register, any other memory chip or cartridge, and networked versions of the same.

It will be appreciated that the embodiments of the present disclosure are not limited to the exact construction that has been described above and illustrated in the accompanying drawings, and that various modifications and changes may be made without departing from the scope thereof. The present disclosure has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The descriptions above are intended to be illustrative, not limiting. Thus, it will be apparent to one skilled in the art that modifications may be made as described without departing from the scope of the claims set out below.

The invention claimed is:

1. A non-transitory computer readable medium that stores a set of instructions that is executable by at least one processor of a computing device to cause the computing device to perform operations for reducing cross-talk contamination in a multi-beam inspection system, the operations comprising:

acquiring a first image and a second image of a first area and a second area on a sample respectively by a multi-beam inspection system, wherein the first image is generated based on a first detection signal from a first detection region of the multi-beam inspection system and the second image is generated based on a second detection signal from a second detection region of the multi-beam inspection system;

determining a main pattern of the first image originating from a first secondary electron beam by using a first reference image corresponding to the first area;

determining whether the first image includes a ghost pattern originating from a second secondary electron beam by using a second reference image corresponding to the second area;

determining a relationship between the first detection signal and beam intensities of the first secondary electron beam and the second secondary electron beam based on whether the first image includes the ghost pattern; and reducing cross-talk contamination from a third detection signal from the first detection region based on the determined relationship.

2. The non-transitory computer readable medium of claim 1, wherein reducing the cross-talk contamination is performed in real time after acquiring the third detection signal.

3. The non-transitory computer readable medium of claim 1, wherein determining the relationship is performed based on analyzing image patches of the first image, wherein the image patches include a first image patch covering an area outside of a main pattern in the first image and the ghost pattern, a second image patch covering the main pattern, and a third image patch covering the ghost pattern.

4. The non-transitory computer readable medium of claim 3, wherein the second image patch only comprises an area that has features constituting the main pattern but not the ghost pattern.

5. The non-transitory computer readable medium of claim 3, wherein the ghost pattern comprises a first ghost pattern and a second ghost pattern.

6. The non-transitory computer readable medium of claim 5, wherein the third image patch comprises a first type of ghost pattern patch and a second type of ghost pattern patch, wherein the first type of ghost pattern patch only comprises an area that has features constituting the first ghost pattern, but not the main pattern and the second ghost pattern.

7. The non-transitory computer readable medium of claim 1, wherein the relationship is in a form of a transform matrix and reducing cross-talk contamination is performed by multiplying the transform matrix to the third detection signal.

8. A method for reducing cross-talk contamination in a multi-beam inspection system, the method comprising:

acquiring a first image and a second image of a first area and a second area on a sample respectively by a multi-beam inspection system, wherein the first image is generated based on a first detection signal from a first detection region of the multi-beam inspection system and the second image is generated based on a second detection signal from a second detection region of the multi-beam inspection system;

determining a main pattern of the first image originating from a first secondary electron beam by using a first reference image corresponding to the first area;

determining whether the first image includes a ghost pattern originating from a second secondary electron beam by using a second reference image corresponding to the second area;

determining a relationship between the first detection signal and beam intensities of the first secondary electron beam and the second secondary electron beam based on whether the first image includes the ghost pattern; and reducing cross-talk contamination from a third detection signal from the first detection region based on the determined relationship.

9. The method of claim 8, wherein reducing the cross-talk contamination is performed in real time after acquiring the third detection signal.

10. The method of claim 8, wherein determining the relationship is performed based on analyzing image patches of the first image, wherein the image patches include a first image patch covering an area outside of a main pattern in the first image and the ghost pattern, a second image patch covering the main pattern, and a third image patch covering the ghost pattern.

11. The method of claim 10, wherein the second image patch only comprises an area that has features constituting the main pattern but not the ghost pattern.

12. The method of claim 10, wherein the ghost pattern comprises a first ghost pattern and a second ghost pattern.

13. The method of claim 12, wherein the third image patch comprises a first type of ghost pattern patch and a second type of ghost pattern patch, wherein the first type of ghost pattern patch only comprises an area that has features constituting the first ghost pattern, but not the main pattern and the second ghost pattern.

14. The method of claim 8, wherein the relationship is in a form of a transform matrix and reducing cross-talk contamination is performed by multiplying the transform matrix to the third detection signal.

15. An image enhancing apparatus comprising:

a memory storing a set of instructions:

at least one processor configured to execute the set of instructions to cause the image enhancing apparatus to perform operations comprising:

acquiring a first image and a second image of a first area and a second area on a sample respectively by a multi-beam inspection system, wherein the first image is generated based on a first detection signal from a first detection region of the multi-beam inspection system and the second image is generated based on a second detection signal from a second detection region of the multi-beam inspection system;

determining a main pattern of the first image originating from a first secondary electron beam by using a first reference image corresponding to the first area;

determining whether the first image includes a ghost pattern originating from a second secondary electron beam by using a second reference image corresponding to the second area;

determining a relationship between the first detection signal and beam intensities of the first secondary electron beam and the second secondary electron beam based on whether the first image includes the ghost pattern; and reducing cross-talk contamination from a third detection signal from the first detection region based on the determined relationship.

16. The image enhancing apparatus of claim 15, wherein reducing the cross-talk contamination is performed in real time after acquiring the third detection signal.

17. The image enhancing apparatus of claim 15, wherein determining the relationship is performed based on analyzing image patches of the first image, wherein the image patches include a first image patch covering an area outside of a main pattern in the first image and the ghost pattern, a second image patch covering the main pattern, and a third image patch covering the ghost pattern.

18. The image enhancing apparatus of claim 17, wherein the second image patch only comprises an area that has features constituting the main pattern but not the ghost pattern.

19. The image enhancing apparatus of claim 17, wherein the ghost pattern comprises a first ghost pattern and a second ghost pattern.

20. The image enhancing apparatus of claim 15, wherein the relationship is in a form of a transform matrix and reducing cross-talk contamination is performed by multiplying the transform matrix to the third detection signal.

* * * * *